(12) United States Patent
Takagiwa

(10) Patent No.: US 11,545,970 B2
(45) Date of Patent: Jan. 3, 2023

(54) CURRENT DETECTION CIRCUIT, CURRENT DETECTION METHOD, AND SEMICONDUCTOR MODULE

(71) Applicant: FUJI ELECTRIC CO., LTD., Kanagawa (JP)

(72) Inventor: Kazumi Takagiwa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 270 days.

(21) Appl. No.: 16/916,075

(22) Filed: Jun. 29, 2020

(65) Prior Publication Data

US 2021/0006242 A1 Jan. 7, 2021

(30) Foreign Application Priority Data

Jul. 3, 2019 (JP) .............................. JP2019-124319

(51) Int. Cl.
| | |
|---|---|
| *H03K 17/0812* | (2006.01) |
| *H03K 17/567* | (2006.01) |
| *G01R 19/165* | (2006.01) |
| *H02M 1/32* | (2007.01) |
| *H03K 5/24* | (2006.01) |
| *G01R 19/00* | (2006.01) |
| *G01R 19/15* | (2006.01) |
| *H02M 1/00* | (2006.01) |

(52) U.S. Cl.
CPC ... *H03K 17/08128* (2013.01); *G01R 19/0092* (2013.01); *G01R 19/15* (2013.01); *G01R 19/16528* (2013.01); *H02M 1/32* (2013.01); *H03K 5/24* (2013.01); *H03K 17/567* (2013.01); *H02M 1/0009* (2021.05); *H02M 1/0025* (2021.05); *H03K 2217/0027* (2013.01)

(58) Field of Classification Search
CPC .......... H02H 1/0007; H02H 3/08; H02H 7/12; H02H 7/222; H02H 3/093
See application file for complete search history.

(56) References Cited

U.S. PATENT DOCUMENTS

| 5,375,029 A | 12/1994 | Fukunaga |
| 10,461,649 B2 | 10/2019 | Maruyama |

(Continued)

FOREIGN PATENT DOCUMENTS

| EP | 2899886 A1 | 7/2015 |
| JP | H06120787 A | 4/1994 |

(Continued)

*Primary Examiner* — Jermele M Hollington
*Assistant Examiner* — Temilade S Rhodes-Vivour

(57) ABSTRACT

There is provide a current detection circuit including: a current detection unit that detects a control current flowing between a control terminal of a semiconductor element of voltage-controlled type having a current detection terminal, and a drive circuit; an overcurrent detection unit that detects an overcurrent in response to a sense current exceeding an overcurrent threshold value, the sense current flowing through the current detection terminal; and an adjustment unit that sets, based on a detection result of the current detection unit, the overcurrent threshold value in a transient period during turn on and turn off of the semiconductor element to be higher than the overcurrent threshold value in a period other than the transient period.

15 Claims, 17 Drawing Sheets

(56) References Cited

U.S. PATENT DOCUMENTS

| | | | | |
|---|---|---|---|---|
| 2012/0049829 | A1* | 3/2012 | Murakami | H02M 1/32 |
| | | | | 327/333 |
| 2014/0192449 | A1* | 7/2014 | Shimizu | H02M 1/36 |
| | | | | 361/93.1 |
| 2015/0311692 | A1* | 10/2015 | Hiyama | H02M 1/08 |
| | | | | 361/31 |
| 2017/0077825 | A1* | 3/2017 | Yamane | H02M 3/33507 |
| 2018/0145503 | A1* | 5/2018 | Minagawa | H02M 1/32 |
| 2019/0310290 | A1* | 10/2019 | Araragi | G01R 19/16528 |
| 2019/0372567 | A1 | 12/2019 | Yoshida | |

FOREIGN PATENT DOCUMENTS

| | | |
|---|---|---|
| JP | 2005130602 A | 5/2005 |
| JP | 2006032393 A | 2/2006 |
| JP | 2015053749 A | 3/2015 |
| JP | 2015139271 A | 7/2015 |
| JP | 2019075940 A | 5/2019 |
| WO | 2018158807 A1 | 9/2018 |

* cited by examiner

CURRENT DETECTION CIRCUIT, CURRENT DETECTION METHOD, AND SEMICONDUCTOR MODULE The contents of the following Japanese patent application(s) are incorporated herein by reference: No. 2019-124319 filed in JP on Jul. 3, 2019

BACKGROUND

1. Technical Field

The present invention relates to a current detection circuit and a current detection method of a semiconductor element of voltage-controlled type having a current detection terminal, and a semiconductor module.

2. Related Art

A semiconductor element of voltage-controlled type such as a field-effect transistor (FET) and an insulated gate bipolar transistor (IGBT) is used in a half bridge drive circuit of a power conversion apparatus or the like in a consumer and industrial area. The semiconductor element of voltage-controlled type includes a current detection terminal (also referred to as a "sense terminal" or a "current sense terminal") to realize a self protection function against an overcurrent, the current detection terminal outputting a current in accordance with an amount of a current flowing through the semiconductor element of voltage-controlled type. By monitoring the current output from the current detection terminal, it is possible to detect an overcurrent state and to realize an overcurrent protection function.

For such an overcurrent protection circuit, for example, an overcurrent protection circuit of a power device described in PTL 1 has been proposed. The overcurrent protection circuit protects an IGBT from the overcurrent, the IGBT incorporating a current detection terminal. In the IGBT, a current flowing through a current sense terminal is in proportion to a collector current. A current detection resistor is connected between the current sense terminal and a ground, and a voltage drop value of the current detection resistor is supplied to a non-inverting input terminal of a protection comparator. A reference voltage is supplied to an inverting input terminal of the protection comparator, and when the voltage drop value exceeds the reference voltage, a driver connected to a gate of the IGBT is deactivated to realize the overcurrent protection function.

At this time, the reference voltage input to the inverting input terminal of the protection comparator is switched between two levels of high and low. In the switching of the reference voltage, a gate voltage between the driver and a gate terminal of the IGBT is compared by a voltage monitoring comparator, and a comparison output of the voltage monitoring comparator is input to a controller which is supplied with an input signal to the driver (for example, FIG. 3, and paragraphs [0046] to [0060] in PTL 1).

The controller is triggered by a rising edge of the input signal input to the driver so as to output a control signal for directing an analog switch to connect to a reference voltage higher than a steady reference voltage solely during a transient state estimation period T which is regarded as a transient period immediately after turn on. Further, the controller regards a period other than the transient state estimation period T as a steady state, and outputs a control signal for directing the analog switch to connect to the steady reference voltage. Therefore, the controller functions as a kind of timer that determines the transient state estimation period T. Note that the transient state estimation period T of the controller is a period from when the input signal rises to when the gate voltage exceeds a reference voltage VREF3 such that an output of a voltage detection comparator rises to a high level.

Further, PTL 2 and PTL 5 disclose overcurrent protection techniques in which current detection terminals of semiconductor elements are used. PTL 3 and PTL 4 disclose overcurrent protection techniques in which current detection terminals of semiconductor elements are not used. PTL 6 discloses a technique for preventing a malfunction due to a surge current in a flyback charging circuit. PTL 7 discloses an overvoltage protection technique in a switching power supply circuit.

CITATION LIST

Patent Literature

[PTL 1] Japanese Unexamined Patent Application Publication No. H06-120787
[PTL 2] Japanese Unexamined Patent Application Publication No. 2006-32393
[PTL 3] Japanese Unexamined Patent Application Publication No. 2015-53749
[PTL 4] Japanese Unexamined Patent Application Publication No. 2015-139271
[PTL 5] International Publication No. WO2018/158807
[PTL 6] Japanese Unexamined Patent Application Publication No. 2005-130602
[PTL 7] Japanese Unexamined Patent Application Publication No. 2019-75940

However, in the related art described in the above described PTL 1, a start condition of the transient state estimation period T is set to a point of time when the input signal rises, and an end condition of the transient state estimation period is set to a point of time when the output of the voltage detection comparator rises to a high level, that is, a point of time when the gate voltage exceeds the reference voltage VREF3. Therefore, the transient state estimation period T may be started by erroneously detecting noise superimposed on the input signal in a period other than an actual transient state estimation period. In this case, a state in which a reference voltage higher than that of the steady state is selected occurs. Therefore, when the transient state estimation period T is started after the IGBT is turned on, there is a problem that the overcurrent protection cannot be normally performed. Here, a type of noise includes lightning surge noise, ESD surge noise, radiated electromagnetic noise, or the like as noise generated in a field. In the related arts described in PTL 2 to PTL 7 as well, it is difficult to properly perform the overcurrent protection using the current detection terminal during the transient period. Hence, the invention has been made in view of the above described problem of the related art, and an object of the invention is to provide a current detection circuit and a current detection method of a semiconductor element in which a start condition of a transient state estimation period is not affected by noise.

SUMMARY

In order to solve the above problem, a first aspect of the invention provides a current detection circuit. The current detection circuit may include a current detection unit that detects a control current flowing between a control terminal of a semiconductor element of voltage-controlled type having a current detection terminal, and a drive circuit;

The current detection circuit may include an overcurrent detection unit that detects an overcurrent in response to a sense current exceeding an overcurrent threshold value, the sense current flowing through the current detection terminal. The current detection circuit may include an adjustment unit that sets, based on a detection result of the current detection unit, the overcurrent threshold value in a transient period during turn on and turn off of the semiconductor element to be higher than the overcurrent threshold value in a period other than the transient period.

The current detection unit may detect a potential difference between a side closer to the control terminal and a side closer to the drive circuit of a first current detection resistor which is electrically connected between the control terminal and the drive circuit.

The current detection circuit may include a voltage detection unit that detects a voltage on the side closer to the drive circuit or the side closer to the control terminal of the first current detection resistor. The current detection circuit may include a voltage determination unit that determines whether the detected voltage obtained by the voltage detection unit exceeds a control reference voltage, The adjustment unit may adjust the overcurrent threshold value, further based on a determination result of the voltage determination unit.

The adjustment unit may set the overcurrent threshold value to be high, provided that both of a condition that the potential difference, which is obtained by subtracting the voltage on the side closer to the control terminal of the first current detection resistor from the voltage on the side closer to the drive circuit, is greater than a first threshold value or that the potential difference, which is obtained by subtracting the voltage on the side closer to the drive circuit of the first current detection resistor from the voltage on the side closer to the control terminal, exceeds a second threshold value to be high and a condition that the detected voltage obtained by the voltage detection unit is lower than or equal to the control reference voltage are satisfied.

The current detection unit may include a first comparator that determines whether the potential difference, which is obtained by subtracting a voltage on the side closer to the control terminal of the first current detection resistor from a voltage on the side closer to the drive circuit, is greater than a first threshold value. The current detection unit may include a second comparator that determines whether the potential difference, which is obtained by subtracting the voltage on the side closer to the drive circuit of the first current detection resistor from the voltage on the side closer to the control terminal, is greater than a second threshold value. The current detection unit may include a selector that selects which of an output of the first comparator or an output of the second comparator is to be output as the detection result of the current detection unit in accordance with a control signal for controlling the semiconductor element.

The selector may output the output of the first comparator as the detection result of the current detection unit when the control signal indicates that the semiconductor element is to be turned on, and may output the output of the second comparator as the detection result of the current detection unit when the control signal indicates that the semiconductor element is to be turned off.

The current detection unit may include a first voltage dividing circuit that divides the voltage on the side closer to the drive circuit of the first current detection resistor and supplies the divided voltage to the first comparator and the second comparator; and The current detection unit may include a second voltage dividing circuit that divides the voltage on the side closer to the control terminal of the first current detection resistor and supplies the divided voltage to the first comparator and the second comparator A second aspect of the invention provides a semiconductor module including: a semiconductor element of voltage-controlled type;

a drive circuit that drives a control terminal of the semiconductor element; and a current detection circuit.

A third aspect of the invention provides a current detection method. The current detection method may include detecting a control current flowing between a control terminal of a semiconductor element of voltage-controlled type having a current detection terminal, and a drive circuit. The current detection method may include detecting an overcurrent in response to a sense current exceeding an overcurrent threshold value, the sense current flowing through the current detection terminal. The current detection method may include adjusting, based on a detection result of the control current, the overcurrent threshold value in a transient period during turn on and turn off of the semiconductor element to be higher than the overcurrent threshold value in a period other than the transient period.

The summary clause does not necessarily describe all necessary features of the embodiments of the present invention. The present invention may also be a sub-combination of the features described above.

DESCRIPTION OF EXEMPLARY EMBODIMENTS

Figure 1:
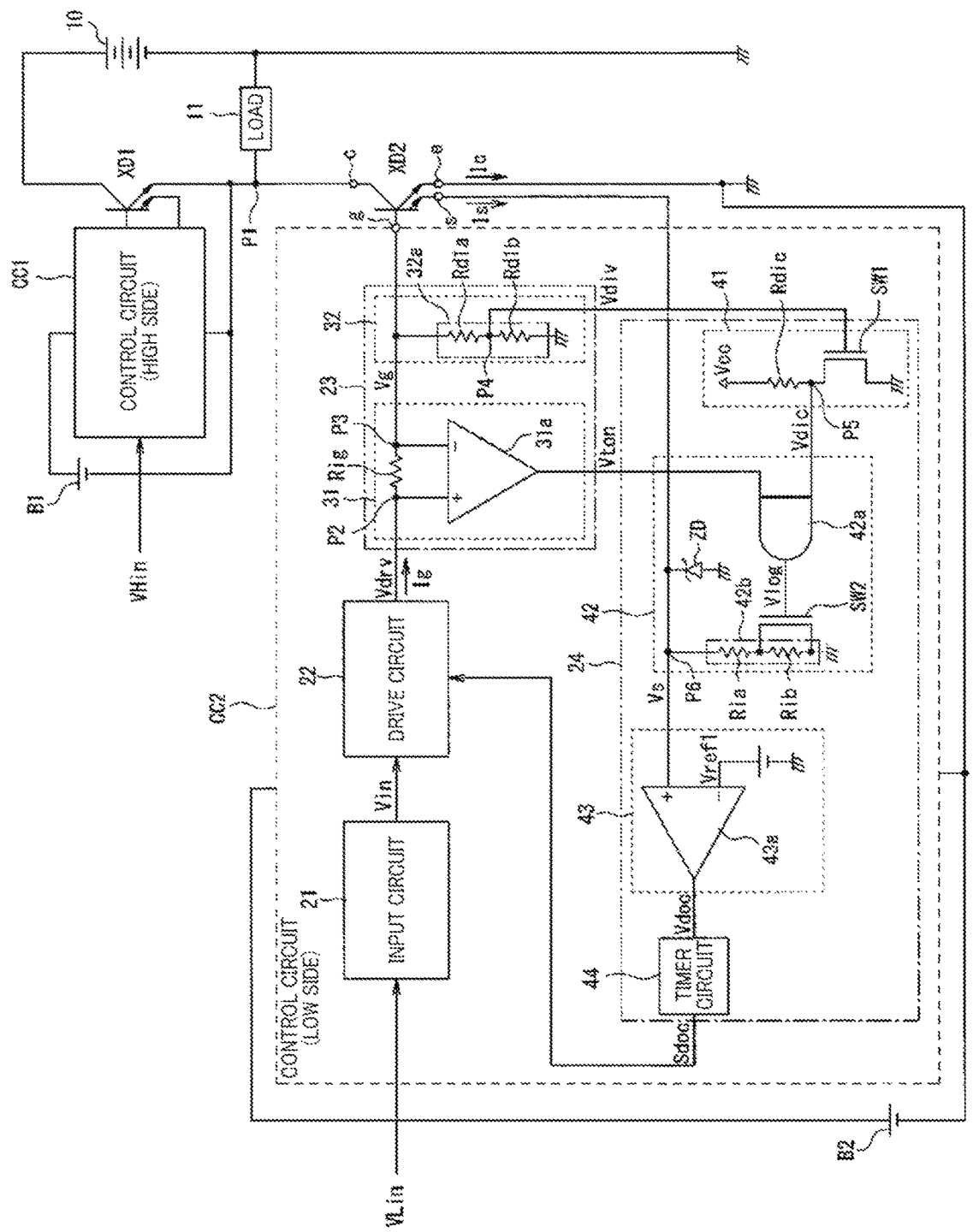
FIG. 1 is a circuit diagram showing a first embodiment of a current detection circuit of a semiconductor element according to the invention.

Next, an embodiment of the invention will be described with reference to drawings. In the following description of the drawings, the same or similar parts are denoted by the same or similar reference signs and numerals. Further, an embodiment described below exemplifies a device and a method for specifying a technical idea of the invention. The technical idea of the invention does not specify materials, shapes, structures, dispositions, and the like of components as follows. The technical idea of the invention can be variously modified within the technical scope defined by the claims described in the claims.

Hereinafter, a first embodiment of a current detection circuit of a semiconductor element according to the invention will be described with reference to the drawings. First, a half bridge circuit to which the invention can be applied will be described. In the half bridge circuit in FIG. 1, a high side (a high potential side) semiconductor element of voltage-controlled type XD1 and a low side (a low potential side) semiconductor element of voltage-controlled type XD2 are connected to a DC power supply 10 in series by a totem pole connection. As the high side semiconductor element of voltage-controlled type XD1, for example, an N-channel or P-channel MOSFET, a P-type or N-type of insulated gate bipolar transistor (IGBT), or the like is used. As the low side semiconductor element of voltage-controlled type XD2, for example, an N-channel MOSFET, an N-type of insulated gate bipolar transistor, or the like is used.

Here, as the semiconductor element of voltage-controlled types XD1, XD2, the N-type insulated gate bipolar transistor (IGBT) is applied. Each of the semiconductor element of voltage-controlled types XD1, XD2 includes a high potential side collector terminal c, a low potential side emitter terminal e, a gate terminal g as a control terminal, and a current detection terminal (a sense terminal) s. The current detection terminal s outputs a sense current Is which is in proportion to a collector current Ic flowing between the collector terminal c and the emitter terminal e.

Freewheeling diodes D1, D2 (not illustrated) are respectively connected to the semiconductor element of voltage-controlled types XD1, XD2, in an anti-parallel configuration. The freewheeling diodes D1, D2 may be parasitic diodes, and may be external diodes. Further, an inductive load 11, for example, is connected between a connection point P1 of the semiconductor element of voltage-controlled type XD1 and the semiconductor element of voltage-controlled type XD2, and a negative electrode side of the DC power supply 10. The load 11 is driven by power output from the connection point P1.

A high side control circuit CC1 is connected to the gate terminal g of the semiconductor element of voltage-controlled type XD1. The control circuit CC1 is driven by an external power supply B1, and forms a gate signal for driving the semiconductor element of voltage-controlled type XD1 based on an input pulse shaped high side drive signal VHin having slopes of rising and falling. The control circuit CC1 outputs the gate signal to the gate terminal of the semiconductor element of voltage-controlled type XD1 so as to control ON/OFF of the semiconductor element of voltage-controlled type XD1.

Figure 2:
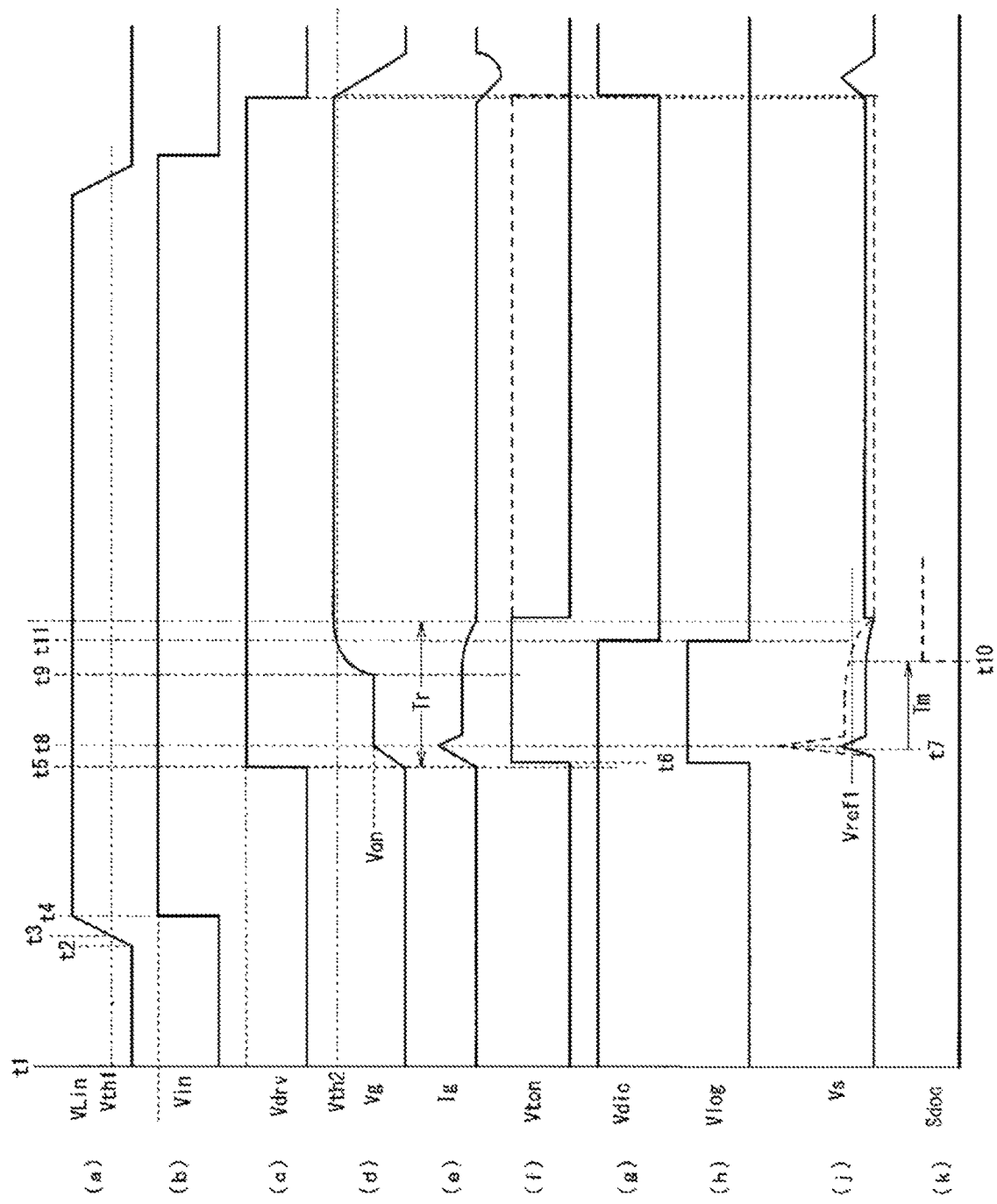
FIG. 2 is a signal waveform diagram for describing an operation of the first embodiment.

Similarly, a low side control circuit CC2 is connected to the gate terminal g of the semiconductor element of voltage-controlled type XD2. The control circuit CC2 is driven also by the external power supply B2. The control circuit CC2 includes an input circuit 21, a drive circuit 22, a gate current/voltage detection unit 23, and a sense current detection circuit 24. A set of the gate current/voltage detection unit 23 and the sense current detection circuit 24 is an example of a current detection circuit that detects an overcurrent of the semiconductor element XD2 based on a detection result of a sense current. As shown in FIG. 2, the input circuit 21 compares a threshold voltage Vth1 with a pulse shaped low side drive signal VLin having slopes of rising and falling so as to form an input signal Vin having a rectangular waveform, the input signal Vin being in an OFF state (a low level) when the low side drive signal VLin is lower than or equal to the threshold voltage Vth1, and being in an ON state (a high level) when the low side drive signal VLin exceeds the threshold voltage Vth1. Furthermore, a function of a noise filter that removes a minute noise pulse or the like which is input to the low side drive signal VLin is included.

The drive circuit 22 outputs a drive signal dry which enters the ON state with a predetermined time delay from when the input signal Vin changes from the OFF state to the ON state after the input of the input signal Vin, and enters the OFF state with a predetermined time delay from when the input signal Vin changes from the ON state to the OFF state. Note that the predetermined time delay operation includes a function of adjusting a signal transmission delay time from the low side drive signal VLin to the low side output terminal (the gate terminal) g. The gate current/voltage detection unit 23 includes a current detection unit 31 and a voltage detection unit 32. The current detection unit 31 detects a gate current Ig flowing between the gate terminal g of the semiconductor element of voltage-controlled type XD2 and the drive circuit 22. In this embodiment, the current detection unit 31 includes a first current detection resistor Rig that is electrically connected between the gate terminal g and the drive circuit 22, and a current detection comparator 31a that detects a potential difference between a side closer to the gate terminal g and a side closer to the drive circuit 22 of the first current detection resistor Rig. One end of the first current detection resistor Rig is connected to the drive circuit 22 and the other end is connected to the gate terminal g of the semiconductor element of voltage-controlled type XD2.

The current detection comparator 31a has a non-inverting input terminal which is connected to a connection point P2 between the drive circuit 22 and the first current detection resistor Rig, and has an inverting input terminal which is connected to a connection point P3 between the first current detection resistor Rig and the gate terminal g of the semiconductor element of voltage-controlled type XD2. The current detection comparator 31a detects the gate current Ig by the potential difference between a drive voltage Vdrv and a gate voltage Vg, the drive voltage Vdrv being a voltage on the side closer to the drive circuit 22 of the first current detection resistor Rig, and being generated when the gate current Ig passes through the first current detection resistor Rig, the gate voltage Vg being a voltage on a side closer to the semiconductor element of voltage-controlled type XD2 of the first current detection resistor Rig. That is, the current detection comparator 31a outputs a current detection signal Vton at the low level when no potential difference is generated between both ends of the first current detection resistor Rig, or when a potential of the gate voltage Vg is higher than a potential of the drive voltage Vdrv. Further, when the potential of the drive voltage Vdrv is higher than the potential of the gate voltage Vg and the potential difference occurs between both ends of the first current detection resistor Rig, the current detection signal Vton at the high level is output. Note that the current detection comparator 31a may switch a level of the current detection signal Vton depending on whether or not the potential difference between the drive voltage Vdrv and the gate voltage Vg has exceeded a predetermined first threshold value (for example, 0 or a positive voltage).

The voltage detection unit 32 detects a voltage on the side closer to the drive circuit 22 or the side closer to the gate terminal g of the first current detection resistor Rig. The voltage that is the target of detection is referred to as a "detected voltage". In this embodiment, the voltage detection unit 32 is constituted by a voltage dividing circuit 32a which is connected between the gate terminal g of the semiconductor element of voltage-controlled type XD2 and a ground. The voltage dividing circuit 32a has a first voltage dividing resistor Rd1a and a second voltage dividing resistor Rd1b which are connected in series, and a divided voltage Vdiv is output from a connection point P4 between the first voltage dividing resistor Rd1a and the second voltage dividing resistor Rd1b. In this embodiment, the divided voltage Vdiv takes a value different from the gate voltage Vg itself, which is a detected voltage indicating a detection result obtained by the voltage detection unit 32; however, the divided voltage Vdiv is an index value indicating a magnitude of the detected voltage. The sense current detection circuit 24 includes a voltage determination unit 41, a voltage level adjustment unit 42, an overcurrent detection unit 43, and a timer circuit 44.

The voltage determination unit 41 determines whether the detected voltage obtained by the voltage detection unit 32 exceeds a control reference voltage. In this embodiment, the voltage determination unit 41 is constituted by a series circuit of a resistor Rdic and a switch element SW1, the resistor Rdic being connected between a DC power supply Vcc and the ground. Here, the switch element SW1 is constituted by, for example, an N-channel MOSFET. The divided voltage Vdiv output from the voltage dividing circuit 32a is supplied to a gate terminal of the switch element SW1. Then, the voltage dividing circuit 32a sets a voltage division ratio for the divided voltage Vdiv to be a threshold voltage (a first threshold voltage) of the switch element SW1 when the gate voltage Vg applied to the gate terminal g of the semiconductor element of voltage-controlled type XD2 is a predetermined threshold voltage Vth2 (for example, 12 V), and thus the switch element SW1 is controlled to be in the ON state by the divided voltage Vdiv when the gate voltage Vg exceeds a predetermined threshold voltage Vth2. Here, the threshold voltage Vth2 is an example of the control reference voltage, and a reference voltage to be compared with a voltage (that is, the gate voltage Vg in this embodiment) which is detected by the voltage detection unit 32, and is for controlling the semiconductor element of voltage-controlled type XD2.

Further, the voltage determination unit 41 outputs, from a connection point P5 between the resistor Rdic and the switch element SW1, a voltage determination signal Vdic as an example of a determination result of the voltage determination unit 41. When the gate voltage Vg is lower than or equal to the threshold voltage Vth2, the switch element SW1 maintains the OFF state, and thus the voltage determination signal Vdic is at the high level. On the other hand, when the gate voltage Vg exceeds the threshold voltage Vth2, the switch element SW1 is in the ON state, and the voltage determination signal Vdic inverts to the low level. The voltage level adjustment unit 42 is an example of an adjustment unit, and adjusts an overcurrent threshold value for determining that the sense current Is flowing through the sense terminal is the overcurrent based on the detection result of the current detection unit 31. In this embodiment, the voltage level adjustment unit 42 adjusts the overcurrent threshold value, further based on the determination result of the voltage determination unit 41. The voltage level adjustment unit 42 includes a logical product circuit (an AND circuit) 42a, a second current detection resistor 42b which is connected between the current detection terminal s of the semiconductor element of voltage-controlled type XD2 and the ground, and a switch element SW2 that adjusts a resistance value of the second current detection resistor 42b. Since the sense current Is output from the current detection terminal s flows through the second current detection resistor 42b, a potential Vs, which is at a connection point P6 between the second current detection resistor 42b and the current detection terminal s of the semiconductor element of voltage-controlled type XD2, is the product of the sense current Is and the resistance value of the second current detection resistor 42b.

In the AND circuit 42a, the current detection signal Vton output from the current detection comparator 31a of the current detection unit 31 is input to one input terminal, and the voltage determination signal Vdic output from the voltage determination unit 41 is input to the other input terminal. When both of the current detection signal Vton and the voltage determination signal Vdic are at high levels, a logical product signal (an AND signal) Vlog at the high level is output from the AND circuit 42a. The second current detection resistor 42b is constituted by two resistors Ria, Rib connected in series. The switch element SW2 is connected to the resistor Rib in parallel. The switch element SW2 is constituted by, for example, an N-channel MOSFET, and has a gate terminal supplied with the AND signal Vlog of the AND circuit 42a. Accordingly, the resistance value of the second current detection resistor 42b and the potential Vs of the connection point P6 are adjusted by the AND signal Vlog.

Therefore, based on the current detection signal Vton and the voltage determination signal Vdic, the current detected voltage Vs of which the voltage level has been adjusted is output from the connection point P6 between the second current detection resistor 42b and the current detection terminal s of the semiconductor element of voltage-controlled type XD2. Note that an overvoltage protection Zener diode ZD is connected between a point between the current detection terminal s of the semiconductor element of voltage-controlled type XD2 and the connection point P6, and the ground. The overcurrent detection unit 43 detects the overcurrent in response to the sense current Is exceeding the overcurrent threshold value, the sense current Is flowing through the current detection terminal s. In this embodiment, the overcurrent detection unit 43 detects the overcurrent based on a result of comparing the sense voltage Vs with a sense reference voltage, the sense voltage Vs corresponding to the sense current Is flowing through the current detection terminal s. The overcurrent detection unit 43 has an overcurrent determination comparator 43a. In the overcurrent determination comparator 43a, the current detected voltage Vs, which is an example of the sense voltage and is output from the voltage level adjustment unit 42, is supplied to a non-inverting input terminal, and a voltage Vref1 (a second threshold voltage), which is an example of the sense reference voltage, is supplied to an inverting input terminal. Therefore, the overcurrent determination comparator 43a outputs an overcurrent detection signal Vdoc at the low level when the current detected voltage Vs is lower than or equal to the reference voltage Vref1, and outputs the overcurrent detection signal Vdoc at the high level when the current detected voltage Vs exceeds the reference voltage Vref1.

The timer circuit 44 is set when the overcurrent detection signal Vdoc output from the overcurrent determination comparator 43a is at the high level, starts counting of a transient state estimation period T, and time is up when a predetermined time has elapsed. The timer circuit 44 outputs an overcurrent protection signal Sdoc at the high level to the drive circuit 22 when the high level state of the overcurrent detection signal Vdoc continues without interruption during a time measurement period Tm until the time is up, and controls the drive circuit 22 to be in an inactive state.

The above shown control circuits CC1, CC2 are realized by an integrated circuit as an example. In this case, some components such as the resistors shown in FIG. 1 may be external components attached to an outside of the integrated circuit. Further, at least one of a set of the control circuit CC1 and the semiconductor element XD1, or a set of the control circuit CC2 and the semiconductor element XD2 may be integrated as a semiconductor module (an intelligent power module), and the control circuits CC1, CC2 and the semiconductor elements XD1, XD2 may be realized as one semiconductor module.

Next, an operation of the first embodiment will be described with reference to FIG. 2. The high side control circuit CC1 and the low side control circuit CC2 respectively receive the high side drive signal VHin and the low side drive signal VLin which have trapezoidal waveforms with phases opposite to each other and have dead time for preventing the semiconductor element of voltage-controlled types XD1 and XD2 from being in the ON state at the same time. The operations of the control circuits CC1, CC2 when the high side drive signal VHin and the low side drive signal VLin are input are basically the same, and the operation of the control circuit CC2 will be described with reference to FIG. 2

At a point of time t1, the low side drive signal VLin input to the input circuit 21 is assumed to be at the low level as shown in FIG. 2. In this state, the input signal Vin output from the input circuit 21 is also at the low level as shown in (b) of FIG. 2, and the drive voltage Vdrv output from the drive circuit 22 is also at the low level. Therefore, the gate voltage Vg and the gate current Ig input to the gate terminal g of the semiconductor element of voltage-controlled type XD2 also maintain the low level as shown in (d) and (e) of FIG. 2, and the semiconductor element of voltage-controlled type XD2 maintains the OFF state.

At this time, since the gate current Ig does not flow through the first current detection resistor Rig, there is no potential difference between both ends, and the current detection signal Vton of the current detection comparator 31a of the current detection unit 31 is also at the low level as shown in (f) of FIG. 2, the divided voltage Vdiv output from the voltage dividing circuit 32a of the voltage detection unit 32 is also at the low level. Therefore, the switch element SW1 of the voltage determination unit 41 maintains the OFF state, and thus the voltage determination signal Vdic is at the high level as shown in (g) of FIG. 2.

Therefore, in the AND circuit 42a of the voltage level adjustment unit 42, the current detection signal Vton of the current detection unit 31 is at the low level and the voltage determination signal Vdic of the voltage determination unit 41 is at the high level, and thus an AND signal Vlog at the low level is output shown in (h) of FIG. 2. Accordingly, when the switch element SW2 maintains the OFF state such that the semiconductor element of voltage-controlled type XD2 is in the ON state and the detected current is output from the current detection terminal s, the current detected voltage Vs across the resistors Ria, Rib of the second current detection resistor 42b that are connected in series is at the high voltage level, which is a normal state. However, when the semiconductor element of voltage-controlled type XD2 is in the OFF state, no detected current is output from the current detection terminal s, and the current detected voltage Vs maintains the low level as shown in (j) of FIG. 2.

Therefore, the overcurrent detection signal Vdoc of the overcurrent determination comparator 43a of the overcurrent detection unit 43 is at the low level, the timer circuit 44 is not set, and the overcurrent protection signal Sdoc output from the timer circuit 44 maintains the low level as shown in (k) in FIG. 2. Therefore, the drive circuit 22 does not transition to the inactive state. Then, the low side drive signal VLin starts to rise at a point of time t2 to reach the threshold voltage Vth1 at a point of time t3, and then at a point of time t4 when the delay time, which is a time delayed by the input circuit 21, has elapsed, the input signal Vin output from the input circuit 21 is inverted from the low level to the high level as shown in (b) of FIG. 2.

Then, at a point of time t5, the drive voltage output from the drive circuit 22 is at the high level, the gate voltage Vg starts to increase, the gate current Ig starts to flow, and charging of a capacitor between the gate and the emitter in the semiconductor element of voltage-controlled type XD2 starts. At this time, by the gate current Ig flowing through the first current detection resistor Rig, the potential difference occurs between both ends of the first current detection resistor Rig. Therefore, at a point of time t6 which is slightly delayed relative to the point of time t5, the potential difference between both ends of the first current detection resistor Rig becomes higher than or equal to a set value such that the current detection signal Vton of the current detection comparator 31a of the current detection unit 31 is inverted from the low level to the high level.

The current detection signal Vton is input to the AND circuit 42a, and the voltage determination signal Vdic, which is input to the AND circuit 42a, of the voltage determination unit 41 is maintained at the high level, the AND signal Vlog is inverted from the low level to the high level. Therefore, the switch element SW2 is in the ON state, the resistor Rib of the second current detection resistor 42b is bypassed by the switch element SW2, the resistance value of the second current detection resistor 42b is reduced, a voltage drop due to the second current detection resistor 42b decreases, and thus the voltage level of the current detected voltage Vs decreases.

On the other hand, the gate voltage Vg increases until reaching an ON voltage Von at a point of time t8, and similarly, the gate current Ig increases. In accordance with the gate current Ig increasing, the current output from the current detection terminal s of the semiconductor element of voltage-controlled type XD2 also increases; however, resistance value of the second current detection resistor 42b is suppressed to a low value, and thus as shown in (j) of FIG.

2, the current detected voltage Vs is limited to a voltage level illustrated by a solid line, which is lower than an actual voltage illustrated by a dashed line. However, although the current detected voltage Vs is suppressed to the low voltage level, at a peak of a transient response during a turn on time described later, the current detected voltage Vs may exceed the reference voltage Vref1 at a point of time t7 before the point of time t8 when the current detected voltage Vs reaches a peak value of the current detected voltage Vs.

Therefore, the overcurrent detection unit 43 outputs the overcurrent detection signal Vdoc which is at the high level while the current detected voltage Vs exceeds the reference voltage Vref1. Accordingly, the timer circuit 44 is set to start a time measurement. Then, by the gate voltage Vg reaching the ON voltage Von at the point of time t8, the semiconductor element of voltage-controlled type XD2 is in the ON state, the collector current flows, and the voltage between the collector and the emitter voltage decreases. At this time, charging of a capacitor between the collector and the gate in the semiconductor element of voltage-controlled type XD2 is started, and the gate voltage Vg maintains a constant value due to the Miller effect. The gate current Ig decreases and then becomes a constant current value, the current output from the current detection terminal s also decreases to a constant current value, and the current detected voltage Vs also decreases to a constant voltage lower than the reference voltage Vref1.

When the current detected voltage Vs is lower than or equal to the reference voltage Vref1, the overcurrent detection signal Vdoc of the overcurrent determination comparator 43a of the overcurrent detection unit 43 returns to the low level. Since a period in which the current detected voltage Vs is higher than or equal to the reference voltage Vref1 is shorter than or equal to the time measurement period Tm set by the timer circuit 44, the overcurrent protection signal Sdoc output from the timer circuit 44 maintains the low level, and the drive circuit 22 maintains an active state. Note that a point of time t10 indicates a point of time when the time measurement period Tm has elapsed from the point of time t7. Further, the dashed line indicates the current detected voltage Vs when the switch element SW2 is turned off. When the state in which the current detected voltage Vs is higher than or equal to the reference voltage Vref1 continues until the point of time t10 as indicated by the dashed line, the overcurrent protection signal Sdoc is at the high level at the point of time t10.

Then, at a point of time t9, the gate voltage Vg starts to increase again, and the gate current Ig starts to decrease. Then, in a case where the gate voltage Vg reaches the threshold voltage Vth2 at a point of time t11, the divided voltage Vdiv output from the voltage dividing circuit 32a of the voltage detection unit 32 reaches a voltage for causing the switch element SW1 of the voltage determination unit 41 to be turned on, and the switch element SW1 is in the ON state. Therefore, the voltage determination signal Vdic output from the voltage determination unit 41 is at the low level. Accordingly, the AND signal Vlog of the AND circuit 42a of the voltage level adjustment unit 42 is inverted to the low level as shown in (h) of FIG. 2. Therefore, the switch element SW2 is in the OFF state, the resistance value of the second current detection resistor 42b returns from the low resistance value to a normal value, and the voltage level of the current detected voltage Vs returns to the normal state.

At the point of time t11, the current detected voltage Vs of which the voltage level has been set to be high is lower than the reference voltage Vref1, and thus the overcurrent detection signal Vdoc of the overcurrent determination comparator 43a is not at the high level, and the timer circuit 44 is not set. Then, in a case where, at a point of time t12, the gate voltage Vg reaches a saturation state in which the gate voltage Vg becomes equal to the drive voltage Vdrv, the gate current Ig also becomes zero. Therefore, there is no potential difference between both ends of the first current detection resistor Rig, and thus the current detection signal Vton of the current detection comparator 31a of the current detection unit 31 is at the low level as shown in (f) of FIG. 2.

Then, after the gate voltage Vg enters the saturation state, the gate current Ig does not flow, and thus an erroneous determination of the transient state is not made and the voltage level of the current detected voltage Vs is not reduced. Therefore, when an overcurrent state or a short circuit actually occurs, the voltage level of the current detected voltage Vs is high, and thus the overcurrent detection signal Vdoc of the overcurrent determination comparator 43a is at the high level, and the timer circuit 44 starts the time measurement. Therefore, when the overcurrent state continues for the set time of the timer circuit 44 or longer, the overcurrent protection signal Sdoc at the high level is output from the timer circuit 44 to the drive circuit 22. Therefore, the drive circuit 22 transitions from the active state to the inactive state, and the drive voltage Vdrv can be suppressed or stopped to avoid the overcurrent state.

Then, the low side drive signal VLin transitions from the high level to the low level, and the input signal Vin output from the input circuit 21 is accordingly inverted from the high level to the low level. Accordingly, the drive circuit 22 is operated to be turned off, the drive voltage Vdrv of the drive circuit 22 is inverted from the high level to the low level (a reference potential) with the delay relative to the input signal Vin by the predetermined time, and the gate voltage Vg gradually decreases to the reference potential. At the same time, a parasitic capacitor of the semiconductor element of voltage-controlled type XD2 is discharged through the first current detection resistor Rig and the drive circuit 22, and thus the gate current Ig increases negatively. Then, the gate current Ig returns to zero at a point of time when the gate voltage Vg reaches the reference potential.

Note that when the gate voltage Vg decreases to the threshold voltage Vth2 or lower, the divided voltage Vdiv of the voltage dividing circuit 32a of the voltage detection unit 32 decreases to the threshold voltage of the switch element SW1 or lower, and the switch element SW1 of the voltage determination unit 41 is in the OFF state. Accordingly, the voltage determination signal Vdic of the voltage determination unit 41 returns to the high level. At this time, in the current detection unit 31, since the gate current Ig is in a negative direction in a reverse direction, the gate voltage Vg becomes higher than the drive voltage Vdrv, as opposed to the turn on time, with respect to the potential difference occurring between both ends of the first current detection resistor Rig. Therefore, the current detection signal Vton of the current detection comparator 31a maintains the low level, and the AND signal Vlog of the AND circuit 42a also maintains the low level.

In this way, in this embodiment, the gate current Ig is detected by the current detection unit 31, and the gate voltage Vg is detected by the voltage detection unit 32. Then, a start of a transient state estimation period Tr from the point of time t5 to the point of time t12 is detected by the gate current Ig, and an end of the transient state estimation period Tr is detected by the gate voltage Vg reaching the threshold voltage Vth2. In the transient state estimation period Tr, the voltage level of the current detected voltage Vs is suppressed to be low by the voltage level adjustment unit 42 in the transient state in which the semiconductor element of voltage-controlled type XD2 is in the turn on state.

In the transient state, as illustrated by the dashed line in (j) of FIG. 2, a waveform of the current detected voltage Vs while the switch element SW1 remains in the OFF state may show a transient response with a period which has a high peak value, during which the current detected voltage Vs is higher than or equal to the reference voltage Vref1, and which continues for the time measurement period Tm or longer, the time measurement period Tm being set by the timer circuit 44. A cause of the transient response is a transient current flowing through the current detection terminal s, which is due to a change rate dV/dt of the gate voltage Vg input to the gate terminal g of the semiconductor element of voltage-controlled type XD2, an influence of the parasitic capacitance of the semiconductor element of voltage-controlled type XD2, a wiring inductance of the module, or the like.

However, in the first embodiment, as illustrated by the dashed line in (j) of FIG. 2, even in a case where the current detected voltage Vs has the period which has the high peak value, during which the current detected voltage Vs is higher than or equal to the reference voltage Vref1, and which is longer than or equal to the time measurement period Tm set by the timer circuit 44, the period in which the current detected voltage Vs is higher than or equal to the reference voltage Vref1 can be shortened to merely a peak period by reducing the voltage level. Therefore, it is possible to prevent an erroneous detection of the overcurrent state in the transient state when the semiconductor element of voltage-controlled type XD2 is turned on.

Figure 3:
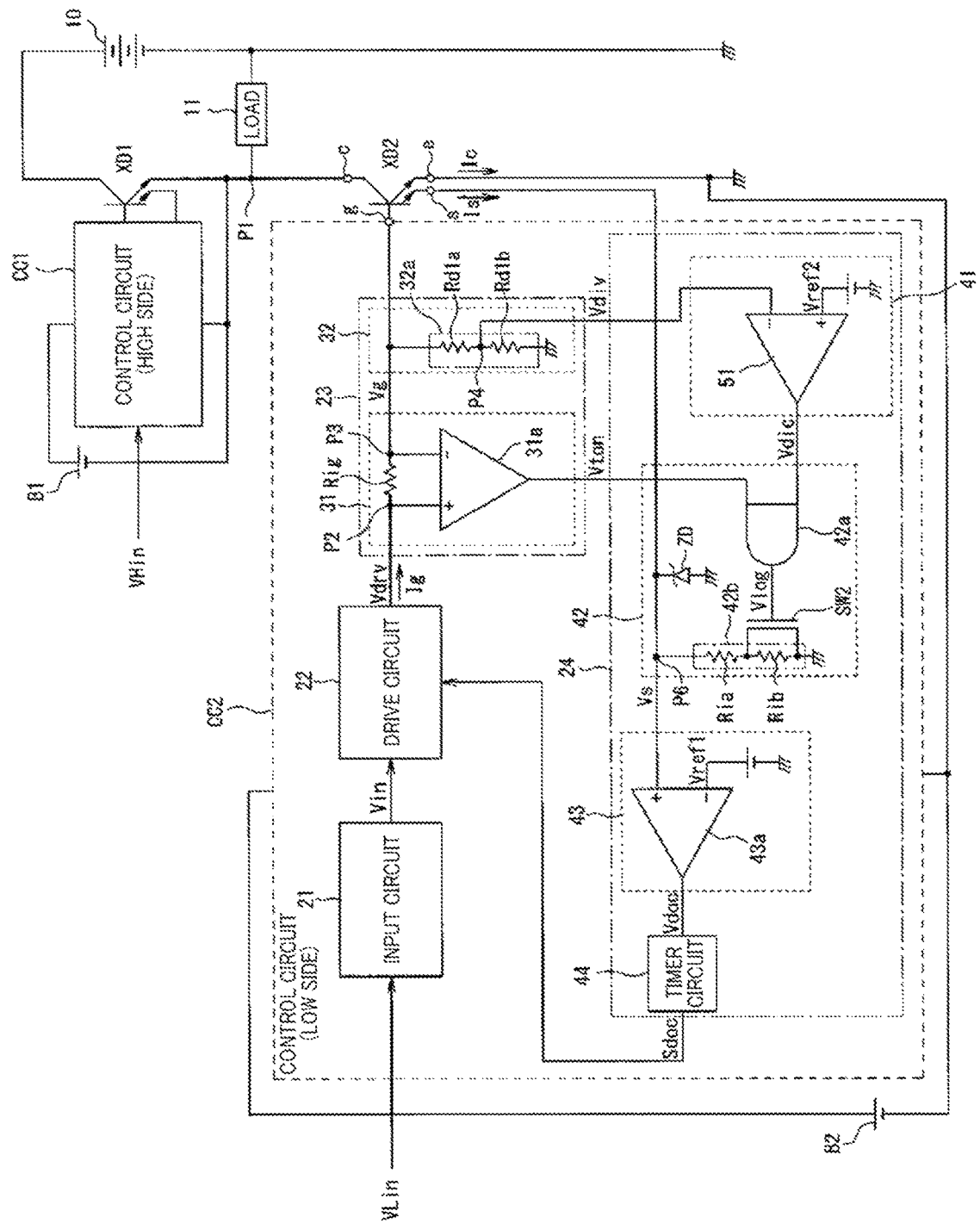
FIG. 3 is a circuit diagram showing a first Modification Example which is a modification example of the first embodiment of the current detection circuit of the semiconductor element according to the invention.

In addition, even when noise such as lightning surge noise, ESD surge noise, and radiated electromagnetic noise is superimposed on the low side drive signal VLin, since the start of the transient state period is detected depending on whether or not the gate current Ig is flowing, the transient state is not detected unless the gate current Ig flows. Therefore, the erroneous detection of the overcurrent state due to an influence of the noise can be prevented. Note that in the first embodiment, the case where the voltage determination unit 41 is constituted by the resistor Rdic and the switch element SW1 has been described. However, the voltage determination unit 41 is not limited to the above described constitution, and may be constituted as shown in FIG. 3.

That is, as the voltage determination unit 41, a voltage determination comparator 51 may be applied, the voltage determination comparator 51 comparing the divided voltage Vdiv of the voltage dividing circuit 32a, and a reference voltage Vref2 (the first threshold voltage: equivalent to the divided voltage when the gate voltage Vg reaches, for example, 12 V). In this case, the divided voltage Vdiv is input to the inverting terminal of the voltage determination comparator 51, and the reference voltage Vref2 is input to the non-inverting terminal. Accordingly, the voltage determination comparator 51 outputs the voltage determination signal Vdic which is at the high level when the divided voltage Vdiv is lower than or equal to the reference voltage Vref2, and outputs, to the voltage level adjustment unit 42, the voltage determination signal Vdic which is at the low level when the divided voltage Vdiv exceeds the reference voltage Vref2. Therefore, the voltage determination signal Vdic similar to that of the above described first embodiment can be generated by the voltage determination comparator 51.

Figure 4:
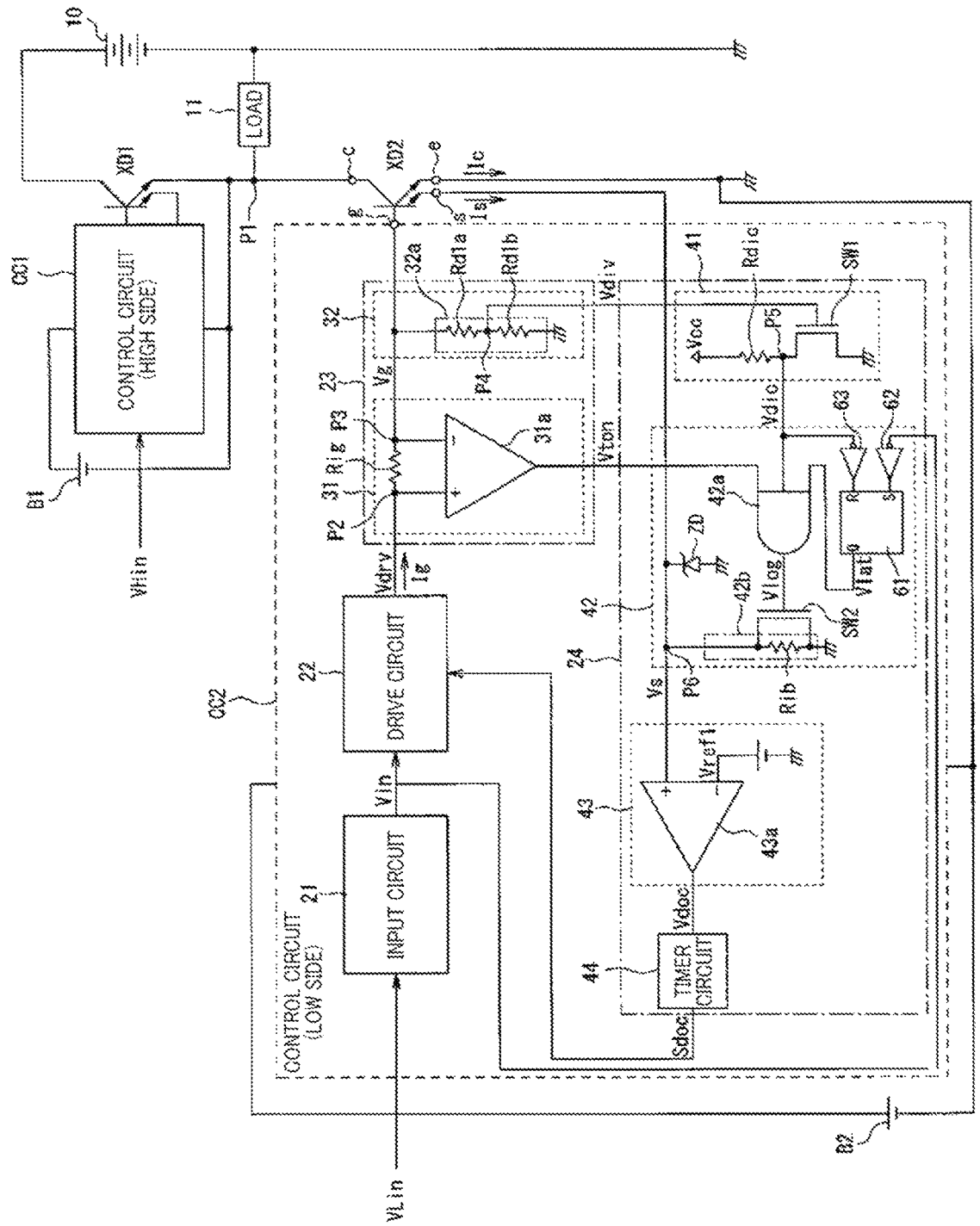
FIG. 4 is a circuit diagram showing a second embodiment of a current detection circuit of a semiconductor element according to the invention.

Next, a second embodiment of the invention will be described with reference to FIG. 4 and FIG. 5. In the second embodiment, the voltage level adjustment unit 42 is changed. That is, in the second embodiment, as shown in FIG. 4, an RS latch circuit (a flip-flop) 61 is added to the voltage level adjustment unit 42 in the first embodiment, the resistor Ria is omitted, and further, the AND circuit 42a is changed to a three-input type. The other configuration is similar to that of the first embodiment, the same signs and numerals are given to the parts corresponding to those in FIG. 1, and the detailed description thereof is omitted.

Here, in the RS latch circuit 61, the input signal Vin output from the input circuit 21 is input to a set terminal S via a NOT circuit 62, and the voltage determination signal Vdic of the voltage determination unit 41 is input to a reset terminal R via a NOT circuit 63. An output terminal Q of the RS latch circuit 61 is input to the input terminal of the AND circuit 42a together with the current detection signal Vton of the current detection unit 31 and the voltage determination signal Vdic of the voltage determination unit 41. In the second embodiment, the input signal Vin, which is output from the input circuit 21 and is shown in (b) of FIG. 5, is inverted by the NOT circuit 62 and is input to the set terminal S of the RS latch circuit 61. Further, the voltage determination signal Vdic, which is output from the voltage determination unit 41 and is shown in (g) of FIG. 5 is input to the reset terminal R of the RS latch circuit 61 via the NOT circuit 63.

Therefore, the RS latch circuit 61 is preferentially set by falling of the input signal Vin, and is reset by falling of the voltage determination signal Vdic. Therefore, a latch output Vlat output from the output terminal Q of the RS latch circuit 61 is preferentially inverted from the low level to the high level at a falling point of time t21 of the input signal Vin, as shown in (h) in FIG. 5. Since the latch output Vlat of the RS latch circuit 61 is input to the AND circuit 42a, the AND signal Vlog of the AND circuit 42a maintains the low level between the point of time t11 and the point of time t21 regardless of the states of the current detection signal Vton and the voltage determination signal Vdic.

Therefore, between the point of time t11 and the point of time t21, the current detected voltage Vs maintains the high voltage level by the voltage level adjustment unit 42. By the way, the current detection unit 31 detects the potential difference between both ends of the first current detection resistor Rig by the current detection comparator 31a, and uses a comparison output as the current detection signal Vton. When the drive voltage Vdrv, which is the output of the drive circuit 22, is at the high level, a steady current flows to the reference potential from the drive circuit 22 via the voltage detection unit 32, and in fact, the potential difference between both ends of the first current detection resistor Rig does not become completely zero. Therefore, depending on voltage balance, it may not be possible to detect an end timing of the transient period at timings when the gate voltage Vg and the gate current Ig are saturated.

Figure 5:
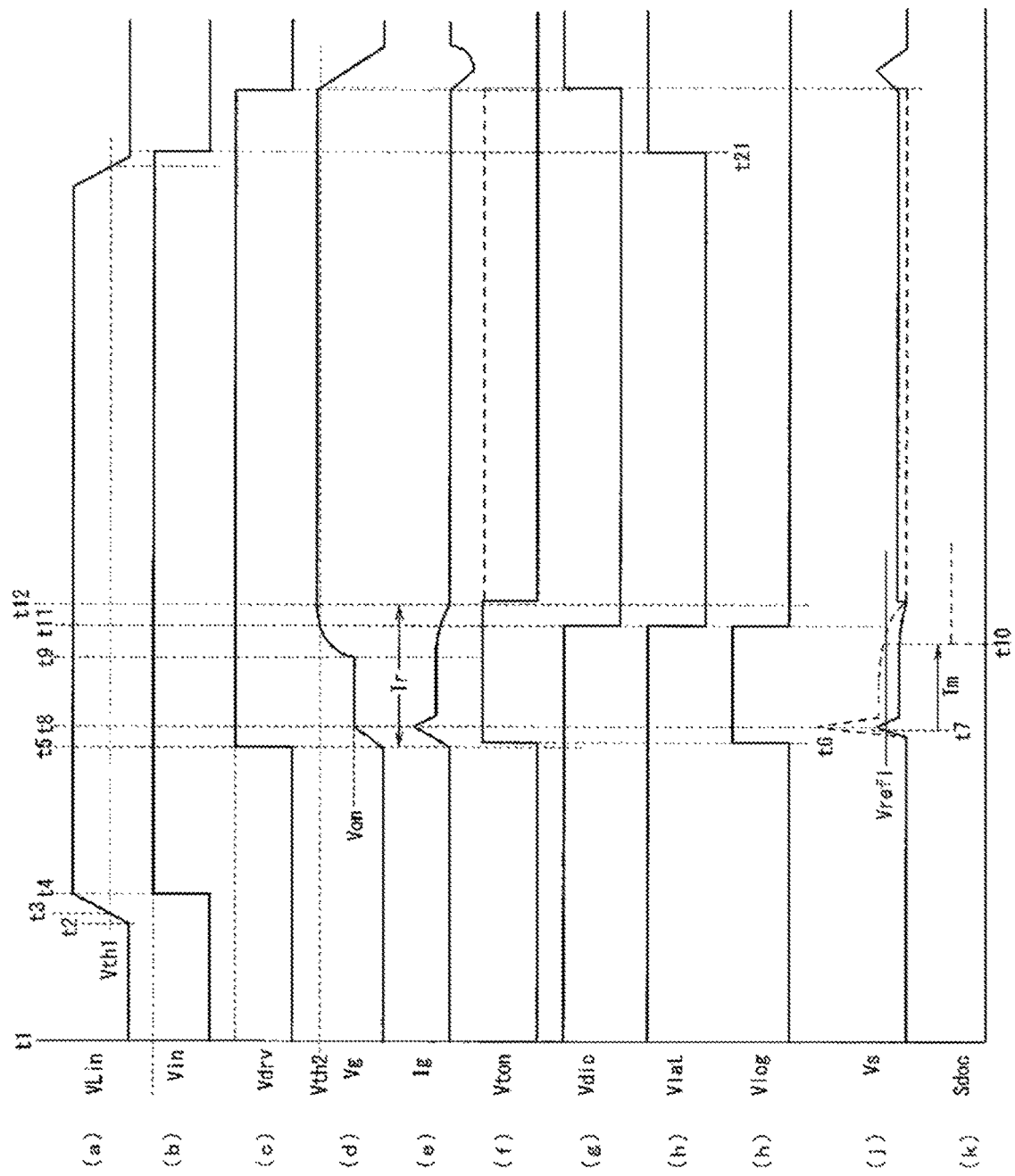
FIG. 5 is a signal waveform diagram for describing an operation of the second embodiment.

In this way, when the detection of the end timing of the transient period by the current detection comparator 31a is not possible, the current detection signal Vton continues to be at the high level even in a case where the gate current Ig returns to zero at the point of time t12 and the transient period ends, as illustrated by the dashed line in (f) of FIG. 5. In this way, in a case where the current detection signal Vton continues to be at the high level even after the point of time t12, when the noise having a long low level section, such as the lightning surge noise, ESD surge noise, and radiated electromagnetic noise, is superimposed on the input signal Vin or the gate terminal g, after the point of time t12 when the gate voltage Vg becomes saturated, the voltage determination signal Vdic of the voltage determination unit 41 is inverted from the low level to the high level.

Therefore, the AND signal Vlog of the AND circuit 42a of the voltage level adjustment unit 42 is at the high level, and a state in which the current detected voltage Vs is adjusted to the low level, and which is not the transient state, though, continues so as to become a state in which the overcurrent cannot be properly detected. However, in the second embodiment, the RS latch circuit 61 is provided, and the RS latch circuit 61 is set by the falling of the input signal Vin, and is reset when the gate voltage Vg reaches the threshold voltage Vth2. By inputting the latch output Vlat of the RS latch circuit 61 to the AND circuit 42a together with the current detection signal Vton and the voltage determination signal Vdic, it is possible to prevent the voltage level adjustment unit 42 from malfunctioning due to the noise or the like.

In the second embodiment, the resistor Ria of the second current detection resistor 42b of the voltage level adjustment unit 42 is omitted, and a parallel circuit of the resistor Rib and the switch element SW2 is constituted. Therefore, when the switch element SW2 is in the OFF state, it is possible to cause a voltage drop to occur by a high resistance value of the resistor Rib, and when the switch element SW2 is in the ON state, although the resistor Rib is bypassed by the switch element SW2, it is possible to positively use an ON resistance of the switch element SW2 as a low resistance value.

Figure 6:
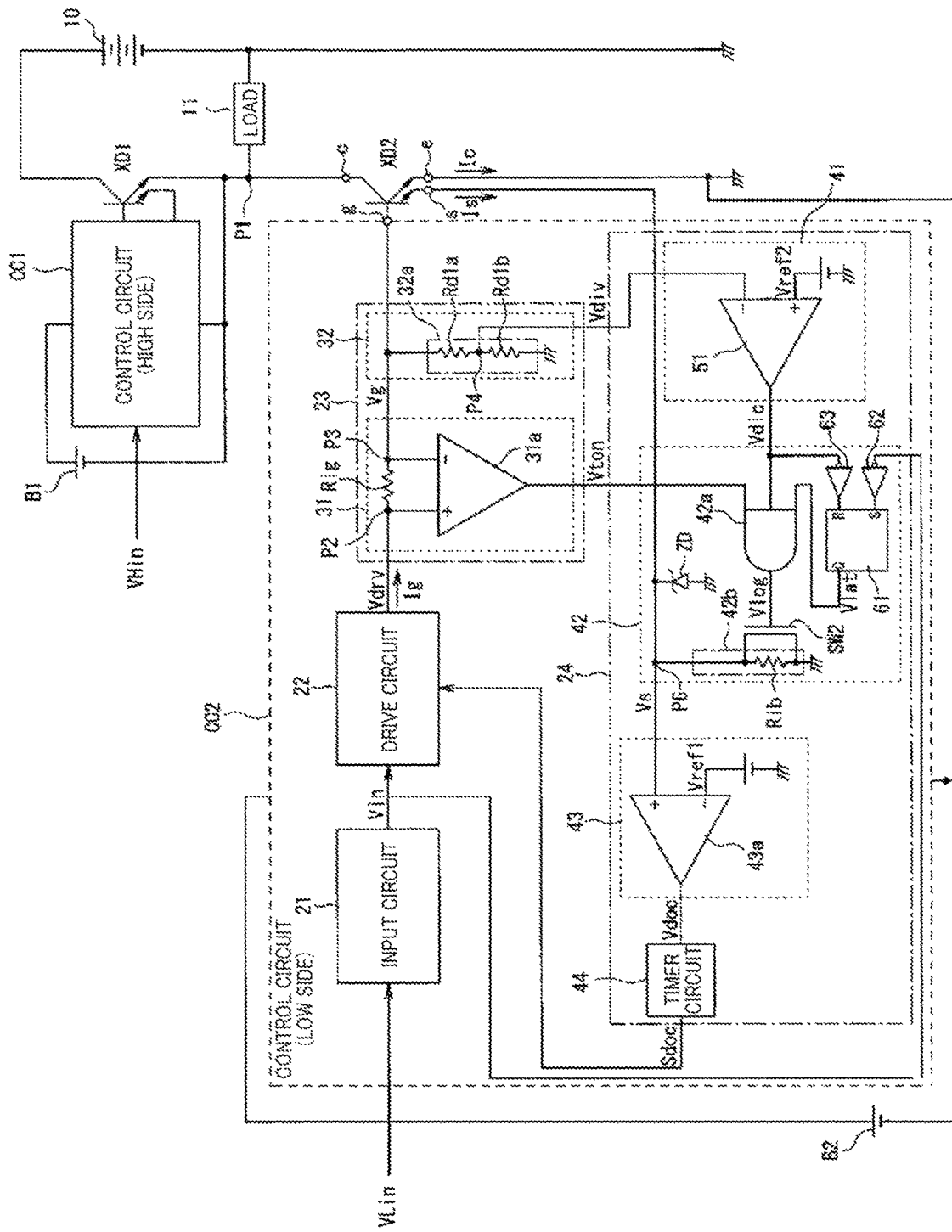
FIG. 6 is a circuit diagram showing a second Modified Example which is a modification example of the second embodiment.

Note that in the second embodiment as well, the case where the voltage determination unit 41 is constituted by the resistor Rdic and the switch element SW1 has been described. However, the voltage determination unit 41 is not limited to the above described constitution, and may be constituted as shown in FIG. 6. That is, as the voltage determination unit 41, the voltage determination comparator 51 may be applied, the voltage determination comparator 51 comparing the divided voltage Vdiv of the voltage dividing circuit 32a, and the reference voltage Vref2 (equivalent to the divided voltage when the gate voltage Vg reaches 12 V). In this case, the divided voltage Vdiv is input to the inverting terminal of the voltage determination comparator 51, and the reference voltage Vref2 is input to the non-inverting terminal. Accordingly, the voltage determination comparator 51 outputs the voltage determination signal Vdic which is at the high level when the divided voltage Vdiv is lower than or equal to the reference voltage Vref2, and outputs, to the voltage level adjustment unit 42, the voltage determination signal Vdic which is at the low level when the divided voltage Vdiv exceeds the reference voltage Vref2. Therefore, the voltage determination signal Vdic similar to that of the above described second embodiment can be generated by the voltage determination comparator 51.

Figure 7:
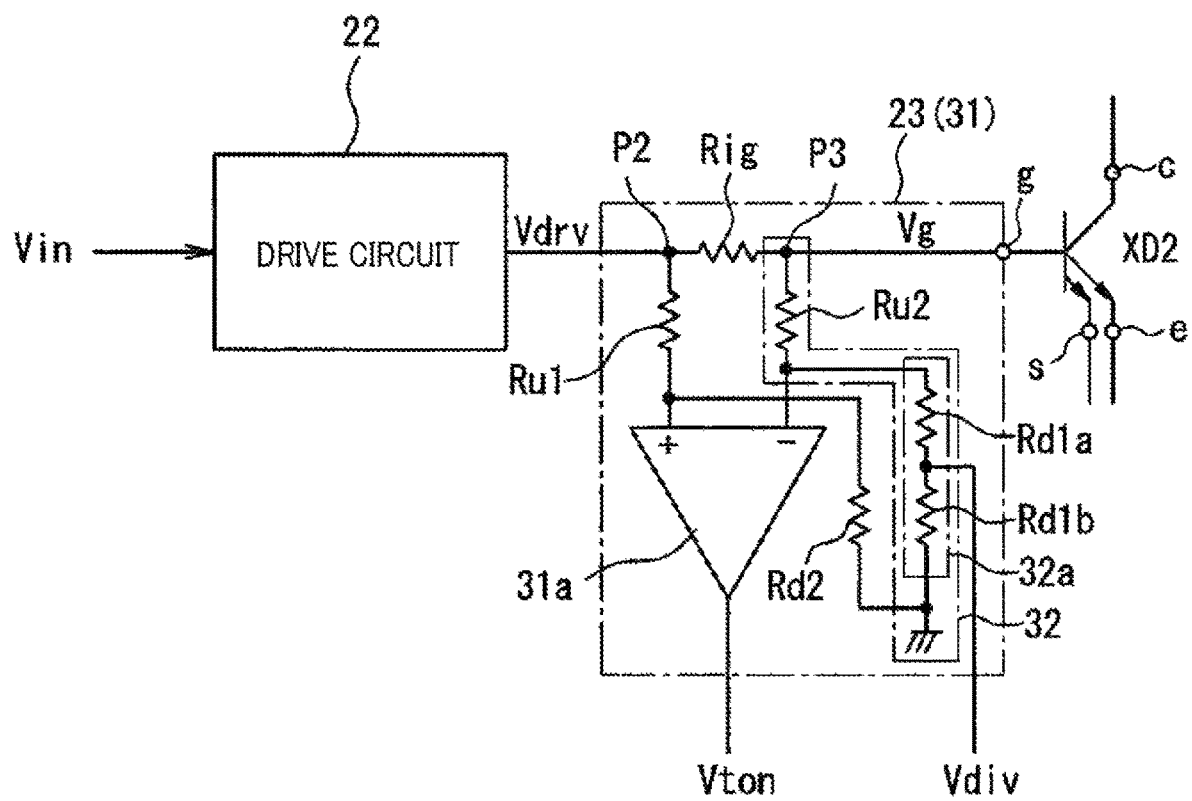
FIG. 7 is a circuit diagram showing a gate current/voltage detection unit according to a third Modification Example.

Further, in the first and second embodiments, the case where the voltage detection unit 32 is constituted by the voltage dividing circuit 32a to divide the gate voltage Vg has been described; however, the invention is not limited to the case, and it is possible to constitute the current detection unit 31 and the voltage detection unit 32 as shown in FIG. 7. That is, resistors Ru1, Ru2 are respectively connected between both ends of the first current detection resistor Rig of the current detection unit 31, and the non-inverting input terminal and the inverting input terminal of the current detection comparator 31a. Further, the resistors Rd1a, Rd1b constituting the voltage dividing circuit 32a are connected between a connection point between the resistor Ru2 and the inverting input terminal of the current detection comparator 31a, and the ground, and a resistor Rd2 is connected between a connection point between the resistor Ru1 and the non-inverting input terminal of the current detection comparator 31a, and the ground. Then, the divided voltage Vdiv is output to the voltage determination unit 41 from a connection point between the resistor Rd1a and the resistor Rd1b which constitute the voltage dividing circuit 32a. Here, with respect to resistance values of the resistors Ru1, Ru2, Rd1a, Rd1b, Rd2, it is preferable to apply a resistor element with high resistance values (several hundred kiloohms to several megaohms) so as not to affect the current flowing through the first current detection resistor Rig. Note that in the configuration, the gate current/voltage detection unit 23 and the current detection unit 31 are the same.

In the configuration, by changing a voltage division ratio Rd2/(Ru1+Rd2) and a resistance ratio (Rd1a+Rd1b)/(Ru2+Rd1a+Rd1b) of the resistors which are connected via points between both ends of the first current detection resistor Rig, and the non-inverting input terminal and the inverting input terminal of the current detection comparator 31a, even when the drive voltage Vdrv and the gate voltage Vg at both ends of the first current detection resistor Rig are equal (Vdrv=Vg), it is possible to obtain a reliable output by providing a difference in the input voltage of the current detection comparators 31a, and thus a stable operation of the current detection comparator 31a is achieved.

Figure 8:
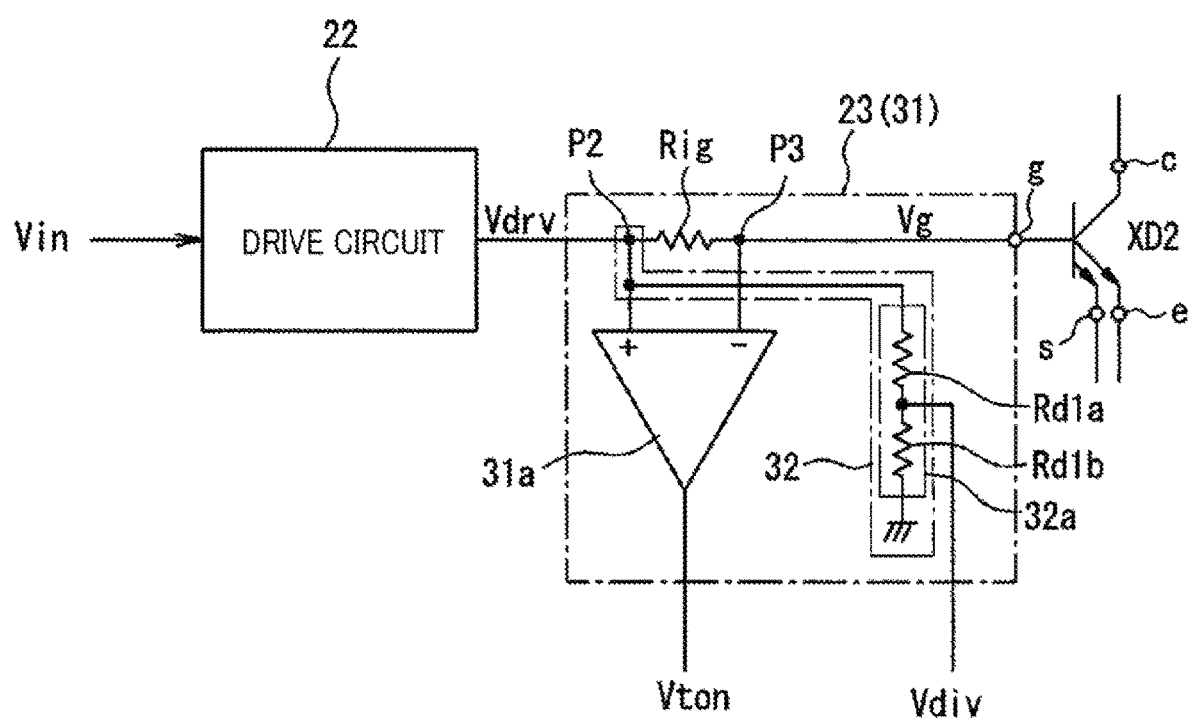
FIG. 8 is a circuit diagram showing a gate current/voltage detection unit according to a fourth Modification Example.
Figure 9:
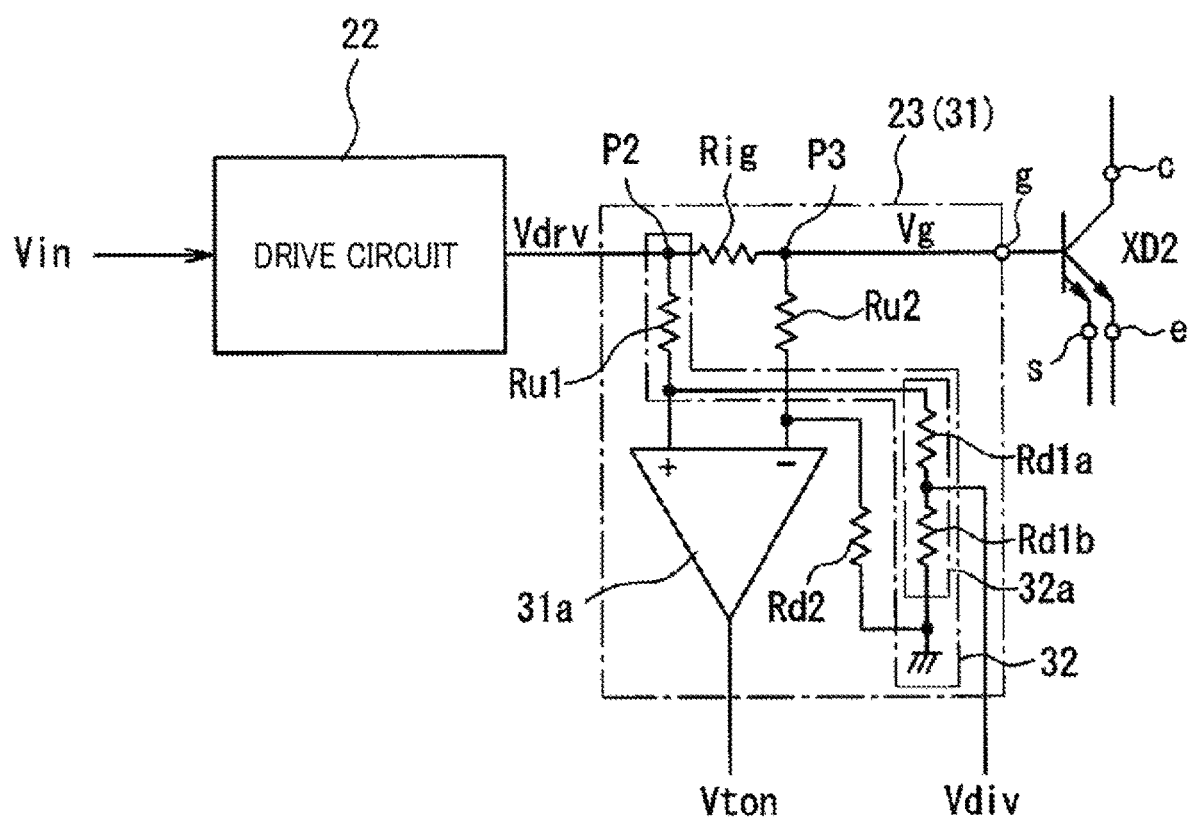
FIG. 9 is a circuit diagram showing a gate current/voltage detection unit according to a fifth Modification Example.

Further, the first and second embodiments have described the case where the gate voltage Vg on the side closer to the gate terminal g of the first current detection resistor Rig, the gate terminal g being in the semiconductor element of voltage-controlled type XD2, is divided by the voltage dividing circuit 32a, and the divided voltage Vdiv is output to the voltage determination unit 41. However, the invention is not limited to the case, and may be configured as shown in FIG. 8 and FIG. 9. That is, in FIG. 8, the voltage dividing circuit 32a of the voltage detection unit 32 in the first embodiment and the second embodiment divides the drive voltage Vdrv on the side closer to the drive circuit 22 of the first current detection resistor Rig. On the other hand, in FIG. 9, in contrast to the configurations of the current detection unit 31 and the voltage detection unit 32 in FIG. 7, the drive voltage Vdrv is divided by the resistors Ru1, Rd2 to be supplied to the non-inverting input terminal of the current detection comparator 31a, and the gate voltage Vg is divided by the resistor Ru2 and the voltage dividing circuit 32a to be supplied to the inverting input terminal of the current detection comparator 31a.

In FIG. 8 and FIG. 9, the voltage detection unit 32 divides the drive voltage Vdrv instead of the gate voltage Vg to generate the divided voltage Vdiv. The reason is that the resistance value of the first current detection resistor Rig is low, and is ignorable in comparison with an output impedance of the drive circuit 22 such that the voltage waveform of the drive voltage Vdrv is similar to the voltage waveform of the gate voltage Vg. Therefore, it is possible to detect the voltage of the drive voltage Vdrv instead of the gate voltage Vg, and to compare the detected voltage with the threshold voltage Vth2 so as to determine the end of the transient state. Further, in the first and second embodiments, the current detection circuit and the current detection method of the low side control circuit CC2 have been described; however, a similar current detection circuit and a current detection method can be applied to the high side control circuit CC1.

Figure 10:
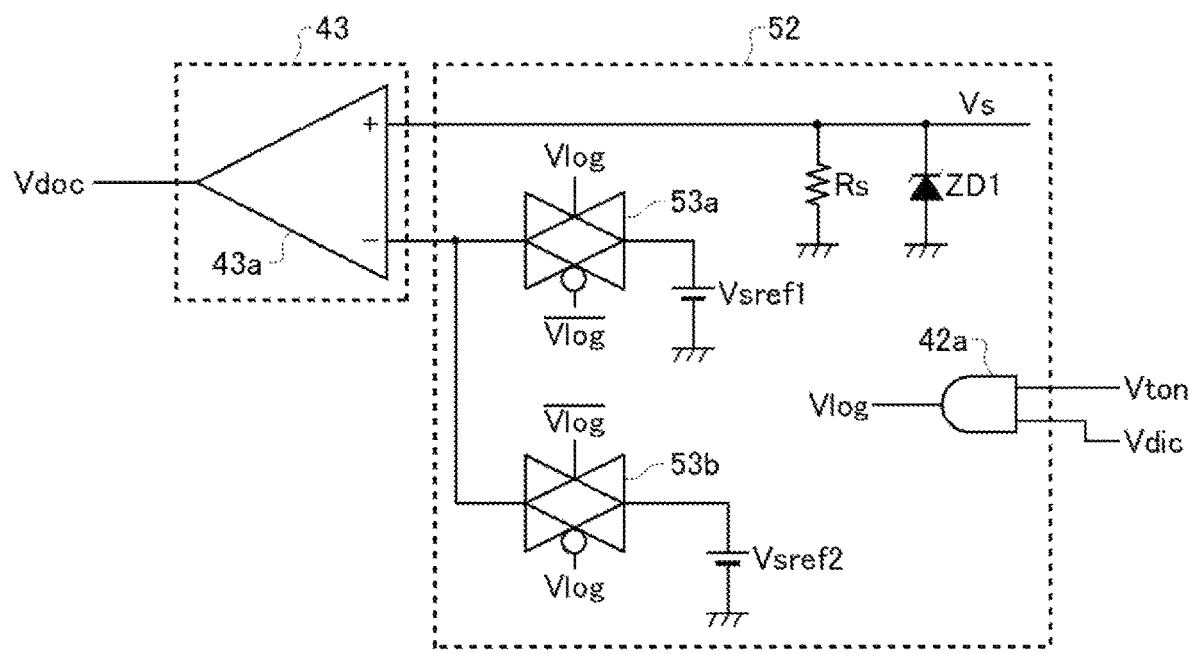
FIG. 10 shows an overcurrent detection unit and an adjustment unit according to a sixth Modification Example.

FIG. 10 shows the overcurrent detection unit 43 and an adjustment unit 52 according to a sixth Modification Example. The overcurrent detection unit 43 and the adjustment unit 52 according to the Modification Example may be used instead of the overcurrent detection unit 43 and the voltage level adjustment unit 42 in FIG. 1, FIG. 3, FIG. 4, and FIG. 6, and the Modification Examples of these.

The overcurrent detection unit 43 detects the overcurrent in response to the sense current Is exceeding the threshold value, the sense current Is flowing through the current detection terminal s. In the Modification Example, the overcurrent detection unit 43 detects the overcurrent based on a result of comparing the current detected voltage (the sense voltage) Vs with a sense reference voltage Vsref1 or Vsref2, the current detected voltage Vs corresponding to the sense current Is flowing through the current detection terminal s. The overcurrent detection unit 43 has an overcurrent determination comparator 43a. The overcurrent determination comparator 43a receives, at the non-inverting input terminal, the current detected voltage Vs output from the adjustment unit 52, and receives, at the inverting input terminal, the sense reference voltage Vsref1 or Vsref2 output from the adjustment unit 52. The overcurrent determination comparator 43a detects the overcurrent in response to the current detected voltage Vs exceeding the sense reference voltage so as to output the overcurrent detection signal Vdoc at the high level.

The adjustment unit 52 adjusts the overcurrent threshold value based on the detection result of the current detection unit 31. Here, the voltage level adjustment unit 42 in FIG. 1, FIG. 3, FIG. 4, FIG. 6, or the like adjusts the overcurrent threshold value by adjusting the voltage level of the current detected voltage Vs; however, the adjustment unit 52 according to the Modification Example adjusts the overcurrent threshold value by adjusting the sense reference voltage based on the detection result of the current detection unit 31.

The adjustment unit 52 has a sense resistor Rs, a Zener diode ZD1, the AND circuit 42a, a voltage source Vsref1, a voltage source Vsref2, and switches 53a, 53b. The sense resistor Rs is connected between the sense terminal s of the semiconductor element XD2 and the reference potential (a ground potential of the control circuit CC2), and generates, on a sense terminal s side, a sense voltage Vs in accordance with the sense current Is. Specifically, the adjustment unit 52 generates the sense voltage Vs with a magnitude obtained by multiplying the flowing sense current Is by a resistance value of the sense resistor Rs.

The Zener diode ZD1 is connected between the sense terminal s of the semiconductor element XD2 and the reference potential such that a cathode is on the sense terminal s side and an anode is on a reference potential side. Similar to the Zener diode ZD in FIG. 1 or the like, by limiting the magnitude of the sense voltage Vs, the Zener diode ZD1 protects the overcurrent detection unit 43 such that the overvoltage is not applied to the overcurrent detection unit 43.

The AND circuit 42a is similar to the AND circuit 42a in FIG. 1 or the like, takes a logical product of the current detection signal Vton of the current detection unit 31 and the voltage determination signal Vdic of the voltage determination unit 41, and outputs the AND signal Vlog. Here, the current detection signal Vton is at the high level when the potential difference, which is obtained by subtracting the voltage on the side closer to the gate terminal g of the first current detection resistor Rig from the voltage on the side closer to the drive circuit 22, exceeds the first threshold value, and the current detection signal Vton is at the low level when the potential difference is lower than or equal to the first threshold value. The voltage determination signal Vdic is at the low level when the gate voltage Vg exceeds the threshold voltage Vth2, and is at the high level when the gate voltage Vg is lower than or equal to the threshold voltage Vth2. Therefore, the AND circuit 42a outputs the AND signal Vlog, the AND signal Vlog being at the high level when the potential difference, which is obtained by subtracting the voltage on the side closer to the gate terminal g of the first current detection resistor Rig from the voltage on the side closer to the drive circuit 22, exceeds the first threshold value, and the gate voltage Vg is lower than or equal to the threshold voltage Vth2, the AND signal Vlog being at the low level in other cases. The AND signal Vlog is at the high level by the current which flows from the side closer to the drive circuit 22 to the side closer to the gate terminal g in accordance with the drive circuit 22 raising the drive voltage Vdrv, and the AND signal Vlog is at the low level when the gate voltage Vg exceeds the threshold voltage Vth2 indicating the high level. Therefore, the AND signal Vlog is at the high level in a period which can be regarded as the transient period during the turn on of the semiconductor element XD2. The adjustment unit 52 according to the Modification Example uses the current detection signal Vton, and additionally uses the AND signal Vlog of the current detection signal Vton and the voltage determination signal Vdic, so that further based on the determination result of the voltage determination unit 41, the adjustment unit 52 can adjust the sense reference voltage, and can accordingly adjust the overcurrent threshold value.

The voltage source Vsref1 generates the first sense reference voltage Vsref1. The voltage source Vsref2 generates the second sense reference voltage Vsref2. Here, the second sense reference voltage Vsref2 is set to a value higher than the first sense reference voltage Vsref1.

Each of the switch 53a and the switch 53b is a transfer gate, for example, and electrically connects or disconnects both terminals in accordance with the AND signal Vlog. The switch 53a is connected in series to the voltage source Vsref1 between the inverting input terminal of the overcurrent determination comparator 43a, and the voltage source Vsref1. The switch 53a electrically connects both terminals when the AND signal Vlog is at the high level, and supplies the first sense reference voltage Vsref1 from the voltage source Vsref1 to the inverting input terminal of the overcurrent determination comparator 43a.

The switch 53b is connected in series to the voltage source Vsref2 between the inverting input terminal of the overcurrent determination comparator 43a, and the voltage source Vsref2. The switch 53b electrically connects both terminals when the AND signal Vlog is at the low level, and supplies the second sense reference voltage Vsref2 from the voltage source Vsref2 to the inverting input terminal of the overcurrent determination comparator 43a.

With the above described adjustment unit 52, based on the detection result of the current detection unit 31 and the determination result of the voltage determination unit 41, it is possible to set the sense reference voltage to be high in the transient period during the turn on of the semiconductor element XD2. Accordingly, the adjustment unit 52 can set the overcurrent threshold value for determining the overcurrent to be higher in the transient period during the turn on of the semiconductor element XD2 than in a normal period.

Figure 11:
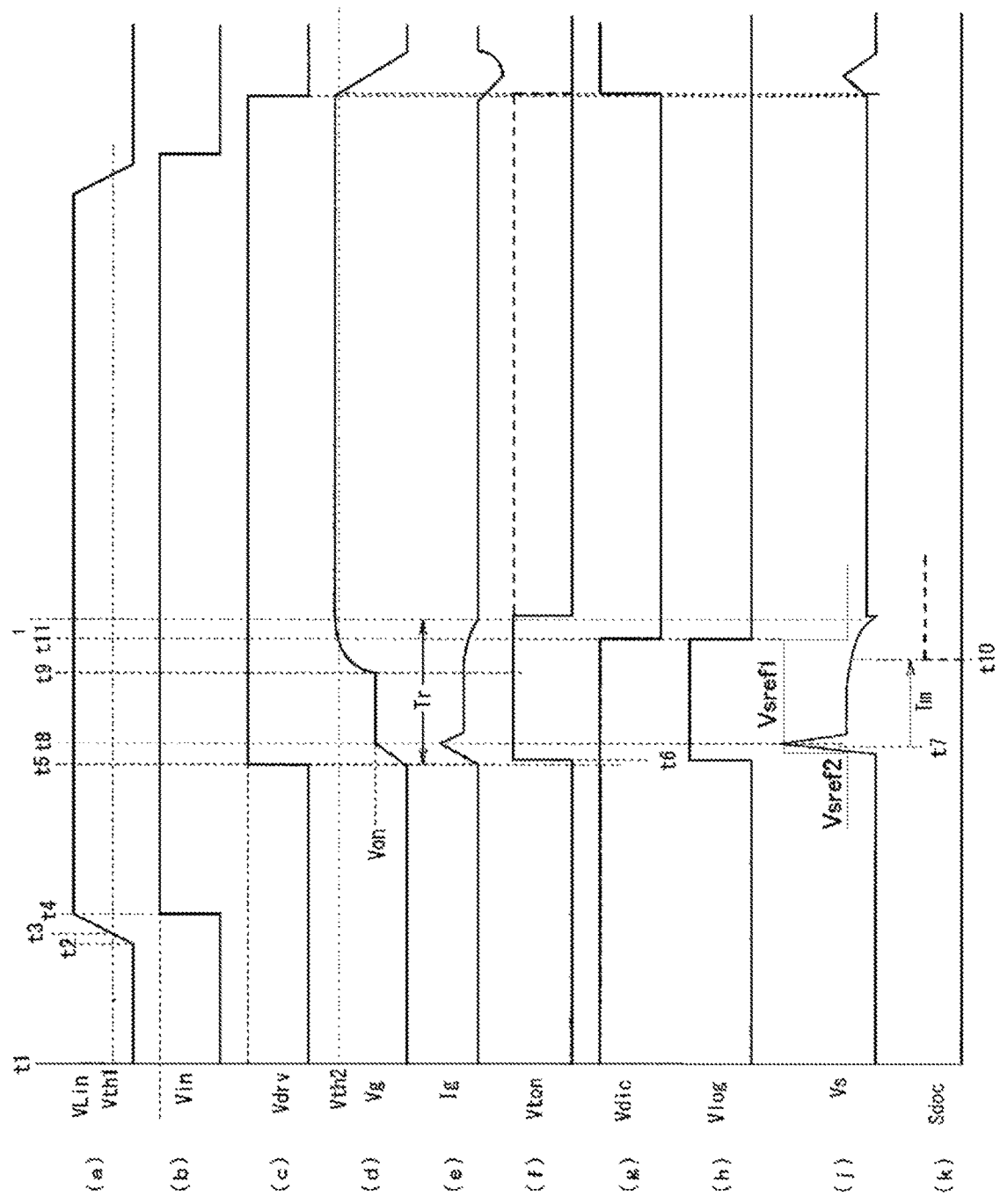
FIG. 11 shows a signal waveform according to an operation of the sixth Modification Example.

FIG. 11 shows a signal waveform according to an operation of the sixth Modification Example. The signal waveform shown in FIG. 11 is different from the signal waveform shown in FIG. 2 in that the overcurrent is detected by changing the sense reference voltage in the transient period during the turn on, and thus hereinafter, the differences will be mainly described, and other descriptions will be omitted.

Between the point of time t1 and the point of time t6, the gate voltage Vg is lower than or equal to the threshold voltage Vth2, and the voltage determination signal Vdic is at the high level; however, the rising of the gate current Ig is not detected, and the potential difference, which is obtained by subtracting the voltage on the side closer to the gate terminal g of the first current detection resistor Rig from the voltage on the side closer to the drive circuit 22, is lower than or equal to the first threshold value, and thus the current detection signal Vton is at the low level. Therefore, the AND signal Vlog is at the low level between the point of time t1 and the point of time t6. Therefore, the switch 53a is in a disconnected state, and the switch 53b is in a connected state. As a result, the second sense reference voltage Vsref2 is supplied to the inverting input terminal of the overcurrent determination comparator 43a.

In a case where the rising of the gate current Ig from the point of time t5 is detected at the point of time t6, and the potential difference, which is obtained by subtracting the voltage on the side closer to the gate terminal g of the first current detection resistor Rig from the voltage on the side closer to the drive circuit 22, exceeds the first threshold value, the current detection signal Vton changes to the high level. Accordingly, the AND signal Vlog changes to the high level. Therefore, the switch 53a is in the connected state, and the switch 53b is in the disconnected state. As a result, the sense reference voltage input to the inverting input terminal of the overcurrent determination comparator 43a changes from the second sense reference voltage Vsref2 to a higher first sense reference voltage Vsref1.

In a case where the gate voltage Vg exceeds the threshold voltage Vth2 at the point of time t11, the voltage determination signal Vdic changes to the low level, and accordingly the AND signal Vlog changes to the low level. Therefore, the switch 53a is in the disconnected state, and the switch 53b is in the connected state. As a result, the sense reference voltage input to the inverting input terminal of the overcurrent determination comparator 43a returns from the first sense reference voltage Vsref1 to the second sense reference voltage Vsref2.

In this way, the adjustment unit 52 can set the sense reference voltage to be high, provided that the potential difference, which is obtained by subtracting the voltage on the side closer to the gate terminal g of the first current detection resistor Rig from the voltage on the side closer to the drive circuit 22, exceeds the first threshold value (the current detection signal Vton is at the high level), and the detected voltage (the gate voltage Vg in the example) obtained by the voltage detection unit 32 is lower than or equal to the control reference voltage (the voltage determination signal Vdic is at the high level). Accordingly, in the transient period during the turn on of the semiconductor element XD2, the adjustment unit 52 can set the overcurrent threshold value for detecting the overcurrent to be high, corresponding to the rising of the sense current Is due to a transient sensing phenomenon, so as to prevent the erroneous detection of the overcurrent.

Further, when the overcurrent threshold value is set to be high by reducing the voltage level of the sense voltage Vs by the voltage dividing in the transient period, the influence of the noise may be more likely to occur. In contrast to this, the overcurrent detection unit 43 and the adjustment unit 52 according to the Modification Example change the sense reference voltage to be compared with the sense voltage Vs instead of reducing the voltage level of the sense voltage Vs, and thus it is possible to reduce the influence of the noise and to detect the overcurrent with a high precision.

Figure 12:
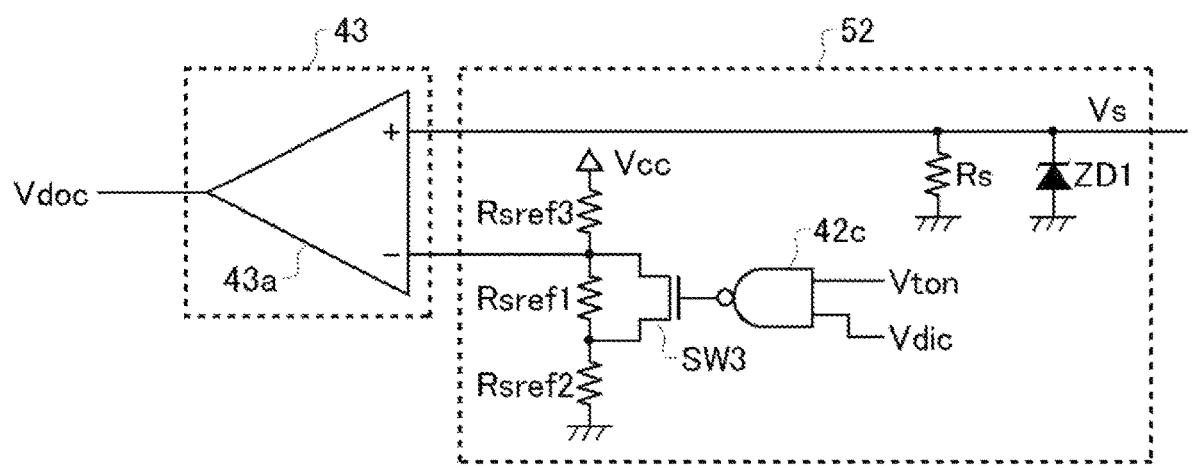
FIG. 12 shows an overcurrent detection unit and an adjustment unit according to a seventh Modification Example.

FIG. 12 shows an adjustment unit 52 and an overcurrent detection unit 43 according to a seventh Modification Example. The overcurrent detection unit 43 and the adjustment unit 52 according to the Modification Example are modification examples of the overcurrent detection unit 43 and the adjustment unit 52 shown in FIG. 10, and thus the description will be omitted except for the differences.

The overcurrent detection unit 43 may be the same as the overcurrent detection unit 43 in FIG. 10. The adjustment unit 52 is different from the adjustment unit 52 shown in FIG. 10 in a method of generating the sense reference voltage to be supplied to the overcurrent determination comparator 43a. In the Modification Example, based on the detection result of the current detection unit 31 and the determination result of the voltage determination unit 41, the adjustment unit 52 changes the voltage division ratio by a resistance voltage dividing circuit connected between the DC power supply Vcc and the ground, so as to change the sense reference voltage.

The adjustment unit 52 includes the sense resistor Rs, the Zener diode ZD1, a plurality of resistors Rsref1, Rsref2, Rsref3, a NOT-AND circuit (a NAND circuit) 42c, and a switch element SW3. The sense resistor Rs and the Zener diode ZD1 are similar to the sense resistor Rs and the Zener diode ZD1 in FIG. 10.

The plurality of resistors Rsref1, Rsref2, Rsref3 are connected in series between the DC power supply Vcc and the ground in order of the resistor Rsref3, the resistor Rsref1, and the resistor Rsref2. The inverting input terminal of the overcurrent determination comparator 43a is connected to a wiring between the resistor Rsref3 and the resistor Rsref1.

The NAND circuit 42c outputs a NOT-AND (NAND) signal of the current detection signal Vton and the voltage determination signal Vdic, that is, a signal obtained by inverting the AND signal Vlog in FIG. 10. Therefore, the NAND circuit 42c outputs the signal, the signal being at the low level when the potential difference, which is obtained by subtracting the voltage on the side closer to the gate terminal g of the first current detection resistor Rig from the voltage on the side closer to the drive circuit 22, exceeds the first threshold value, and the gate voltage Vg is lower than or equal to the threshold voltage Vth2, the signal being at the high level in other cases.

The switch element SW3 has two main terminals connected to both ends of the resistor Rsref1, and a control terminal connected to an output of the NAND circuit 42c. The switch element SW3 is in the disconnected state when the signal output from the NAND circuit 42c is at the low level. In this case, the DC power supply Vcc is divided by the three resistors Rsref1, Rsref2, Rsref3. As a result, the adjustment unit 52 divides the DC power supply Vcc with a ratio of (Rsref1+Rsrf2)/(Rsref1+Rsref2+Rsref3) to supply the divided voltage to the inverting input terminal of the overcurrent determination comparator 43a. The divided voltage may correspond to the first reference voltage Vsref1.

Further, the switch element SW3 is in the connected state when the signal output from the NAND circuit 42c is at the high level. In this case, both ends of the resistor Rsref1 are electrically connected by the switch element SW3, and the resistor Rsref1 is bypassed. In this case, the resistor Rsref2 and the resistor Rsref3 divides the DC power supply Vcc with a ratio of (Rsref2)/(Rsref1+Rsref2+Rsref3) to supply the divided voltage to the inverting input terminal of the overcurrent determination comparator 43a. The divided voltage may correspond to the second reference voltage Vsref2.

Accordingly, the adjustment unit 52 can supply, as the first reference voltage, a value of Vcc×(Rsref1+Rsref2)/(Rsref1+Rsref2+Raref3) to the overcurrent detection unit 43 in the transient period during the turn on, when the potential difference, which is obtained by subtracting the voltage on the side closer to the gate terminal g of the first current detection resistor Rig from the voltage on the side closer to the drive circuit 22, exceeds the first threshold value, and the gate voltage Vg is lower than or equal to the threshold voltage Vth2, and the adjustment unit 52 can supply, as the second reference voltage, a value of Vcc×(Rsref2)/(Rsref1+Rsref2+Rsref3) to the overcurrent detection unit 43 in other cases.

Figure 13:
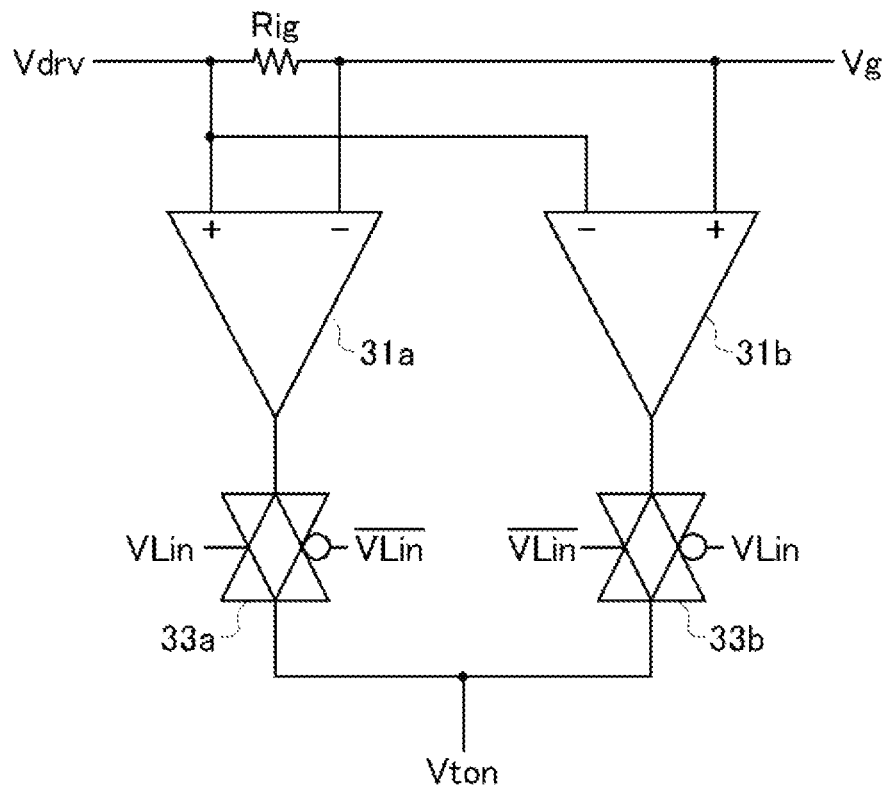
FIG. 13 shows a current detection unit according to an eighth Modification Example.

FIG. 13 shows a current detection unit 31 according to an eighth Modification Example. The current detection unit 31 according to the Modification Example may be used instead of the current detection unit 31 in FIG. 1, FIG. 3, FIG. 4, and FIG. 6, and the Modification Examples of these, and may be used together with the overcurrent detection unit 43 and the adjustment unit 52 shown in FIG. 10 or FIG. 12.

The current detection unit 31 according to the Modification Example output the current detection signal Vton such that the voltage level adjustment unit 42 or the adjustment unit 52 can set the overcurrent threshold value in the transient period during the turn on and turn off of the semiconductor element XD2 to be higher than the overcurrent threshold value in a period other than the transient period. The current detection unit 31 has the first current detection resistor Rig, current detection comparators 31a, 31b, and switches 33a, 33b.

The first current detection resistor Rig is similar to the first current detection resistor Rig shown in FIG. 1 or the like. The current detection comparator 31a is an example of a first comparator, and is similar to the current detection comparator 31a shown in FIG. 1 or the like. The current detection comparator 31a has the non-inverting input terminal which is connected to the side closer to the drive circuit 22 of the first current detection resistor Rig, and has the inverting input terminal which is connected to the side closer to the gate terminal g of the first current detection resistor Rig. Then, the current detection comparator 31a detects the gate current Ig flowing from the side closer to the drive circuit 22 to the side closer to the gate terminal g in accordance with the drive voltage Vdrv changing from the low level to the high level to turn on the semiconductor element XD2. More specifically, the current detection comparator 31a determines whether the potential difference, which is obtained by subtracting the voltage on the side closer to the gate terminal g of the first current detection resistor Rig from the voltage on the side closer to the drive circuit 22, is greater than the first threshold value (for example, 0 or a positive voltage). Then, the current detection comparator 31a outputs the current detection signal which is at the high level when the potential difference is greater than the first threshold value, and is at the low level when the potential difference is lower than or equal to the first threshold value. Here, the current detection comparator 31a may have hysteresis, and may change the current detection signal from the high level to the low level in accordance with the potential difference becoming lower than or equal to a threshold value (0 or positive), which is lower than the first threshold value.

The current detection comparator 31b is an example of a second comparator, and has an inverting input terminal which is connected to the side closer to the drive circuit 22 of the first current detection resistor Rig, and a non-inverting input terminal which is connected to the side closer to the gate terminal g of the first current detection resistor Rig. Then, the current detection comparator 31b detects the gate current Ig flowing from the side closer to the gate terminal g to the side closer to the drive circuit 22 in response to the drive voltage Vdrv changing from the high level to the low level to turn off the semiconductor element XD2. More specifically, the current detection comparator 31b determines whether the potential difference, which is obtained by subtracting the voltage on the side closer to the drive circuit 22 of the first current detection resistor Rig from the voltage on the side closer to the gate terminal g, is greater than the second threshold value (for example, 0 or a positive voltage). Then, the current detection comparator 31b outputs the current detection signal which is at the high level when the potential difference is greater than the second threshold value, and is at the low level when the potential difference is lower than or equal to the second threshold value. Here, the current detection comparator 31b may have hysteresis, and may change the current detection signal from the high level to the low level in accordance with the potential difference becoming lower than or equal to a threshold value (0 or positive) than the second threshold value. Note that the current detection comparator 31b may have the same characteristic as the current detection comparator 31a, and the first threshold value and the second threshold value may be substantially the same.

Both of the switches 33a, 33b function as selectors that select which of an output of the current detection comparator 31a or an output of the current detection comparator 31b is to be output as the detection result of the current detection unit 31, in accordance with a control signal for controlling the semiconductor element XD2. Here, the control signal for controlling the semiconductor element XD2 is a signal for controlling the gate voltage Vg of the semiconductor element XD2, and is the drive signal VLin input to the control circuit CC2 in the Modification Example. Alternatively, the control signal may be the input signal Vin to the drive circuit 22, the drive signal dry output by the drive circuit 22, or the like.

In the switches 33a, 33b functioning as selectors, when the control signal indicates that the semiconductor element XD2 is to be turned on, that is, for example, when the drive signal VLin is at the high level, the switch 33a is in the connected state and the switch 33b is in the disconnected state, and the output of the current detection comparator 31a is output as the detection result of the current detection unit 31. On the other hand, in the switches 33a, 33b, when the control signal indicates that the semiconductor element is to be turned off, that is, for example, when the drive signal VLin is at the low level, the switch 33a is in the disconnected state and the switch 33b is in the connected state, and the output of the current detection comparator 31b is output as the detection result of the current detection unit 31. Accordingly, when the drive signal VLin is at the high level, the current detection unit 31 detects whether the gate current Ig flows from the drive circuit 22 to the gate terminal g, and when the drive signal VLin is at the low level, the current detection unit 31 detects whether the gate current Ig flows from the gate terminal g to the drive circuit 22. Then, during both of the turn on period and the turn off period of the semiconductor element XD2, the current detection unit 31 sets the current detection signal Vton to the high level in accordance with the detection of the gate current Ig corresponding to the period. In response to this, the voltage level adjustment unit 42 can set the overcurrent threshold value to be high, provided that both of a condition that the potential difference, which is obtained by subtracting the voltage Vg on the side closer to the gate terminal g of the first current detection resistor Rig from the voltage Vdrv on the side closer to the drive circuit 22, is greater than the first threshold value, or the potential difference, which is obtained by subtracting the voltage Vdrv on the side closer to the drive circuit 22 of the first current detection resistor Rig from the voltage on the side closer to the gate terminal g, is greater than the second threshold value and a condition that the detected voltage from the voltage detection unit 32 is lower than or equal to the control reference voltage are satisfied.

Figure 14:
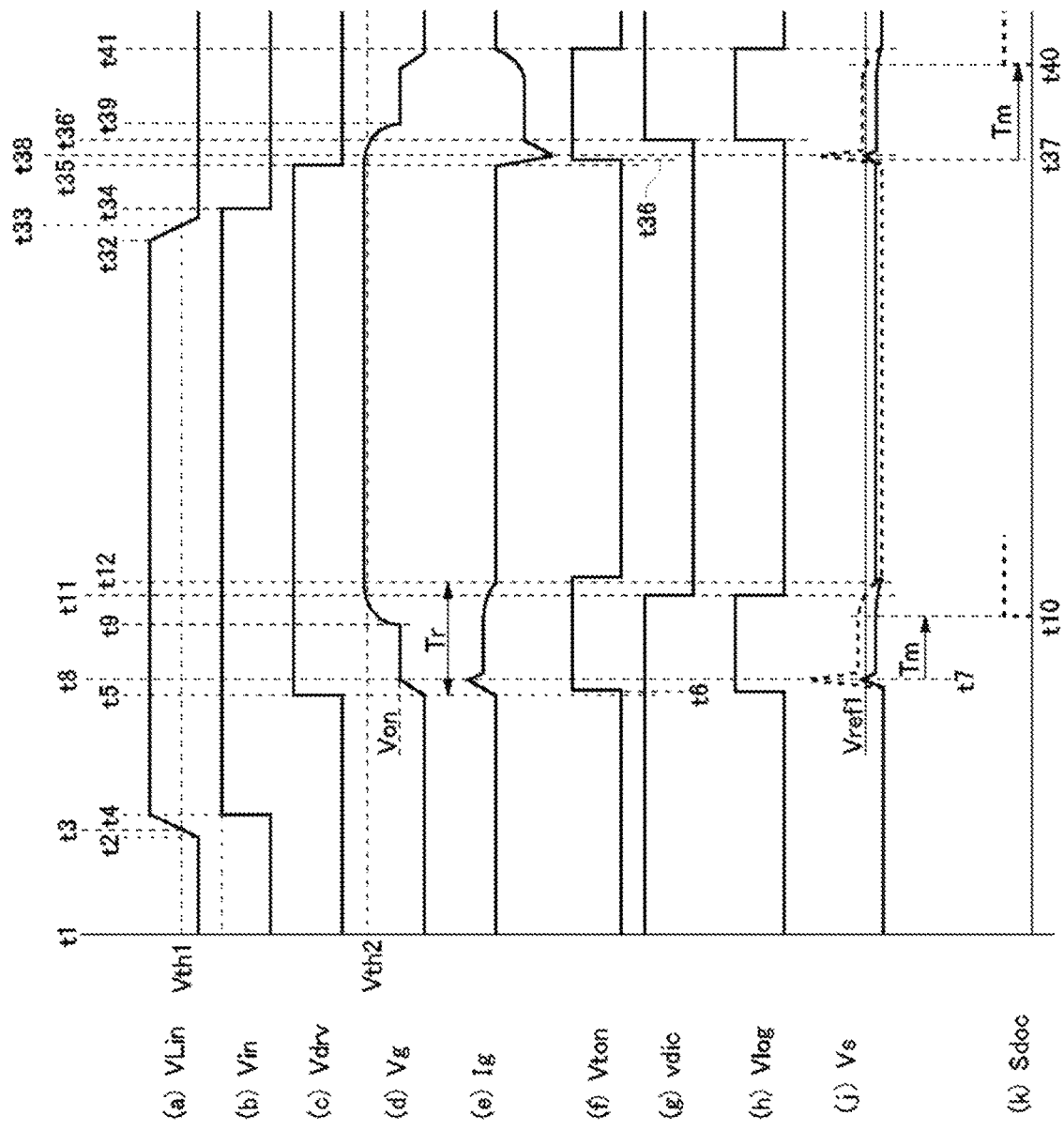
FIG. 14 shows a signal waveform according to an operation of the eighth Modification Example.

FIG. 14 shows a signal waveform according to an operation of the eighth Modification Example. The signal waveform is similar to the signal waveform shown in FIG. 2 with respect to the turn on operation of the semiconductor element XD2, and thus hereinafter the description will be omitted except for the differences.

In a case where the drive signal VLin reaches the threshold voltage Vth1 at the point of time t3, the switch 33a is in the connected state, and the switch 33b is in the disconnected state. Therefore, the current detection unit 31 outputs the output of the current detection comparator 31a as the current detection signal Vton. Since the operation of the current detection comparator 31a is similar to that of the current detection comparator 31a shown in FIG. 1, an operation waveform described below during the turn on operation of the semiconductor element XD2 is also similar to an operation waveform of FIG. 2.

The turn off operation of the semiconductor element XD2 is as follows. In a case where the drive signal VLin starts to fall at a point of time t32, and reaches the threshold voltage Vth1 at a point of time t33, the switch 33a is in the disconnected state, and the switch 33b is connected state. Accordingly, in the turn off operation of the semiconductor element XD2, the current detection unit 31 outputs the output of the current detection comparator 31b as the current detection signal Vton.

At a point of time t34 when the delay time, which is the time delayed by the input circuit 21, has elapsed from the point of time t33, the input circuit 21 inverts the input signal Vin from the high level to the low level. Accordingly, the drive circuit 22 changes the drive voltage Vdrv to the low level at a point of time t35. Accordingly, the gate voltage Vg starts to decrease, the gate current Ig starts to flow from the gate terminal g to the drive circuit 22, and discharging of the capacitor between the gate and the emitter of the semiconductor element XD2 is started. At this time, by the gate current Ig flowing through the first current detection resistor Rig, the potential difference occurs between both ends of the first current detection resistor Rig. In a case where the potential difference between both ends of the first current detection resistor Rig is greater than the second threshold value at a point of time t36, the current detection comparator 31b of the current detection unit 31 inverts the current detection signal Vton from the low level to the high level.

In contrast to this, as the drive voltage Vdrv changes to the low level at the point of time t35, the gate current Ig flowing from the side closer to the gate terminal g to the side closer to the drive circuit 22 increases, and reaches a peak at a point of time t38. Note that the magnitude of the gate current flowing from the side closer to the gate terminal g to the side closer to the drive circuit 22 is illustrated as a negative magnitude. In the Modification Example, before limiting the current detected voltage Vs to the voltage level, illustrated by the solid line, at a point of time t36' described below, the point of time t38 at which the gate current Ig reaches the peak may arrive.

In a case where the current detected voltage Vs exceeds the reference voltage Vref1 at a point of time t37, the overcurrent detection unit 43 outputs the overcurrent detection signal Vdoc which is at the high level while the current detected voltage Vs exceeds the reference voltage Vref1. Accordingly, the timer circuit 44 is set to start the time measurement.

In a case where the gate voltage Vg is lower than or equal to the threshold voltage Vth2 at the point of time t36', the divided voltage Vdiv output from the voltage dividing circuit 32a of the voltage detection unit 32 drops to a voltage for causing the switch element SW1 of the voltage determination unit 41 to be in the OFF state, and the switch element SW1 is in the OFF state. Therefore, the voltage determination unit 41 changes the voltage determination signal Vdic from the low level to the high level. In response to this, the AND circuit 42a of the voltage level adjustment unit 42 inverts the AND signal Vlog from the low level to the high level. Accordingly, the switch element SW2 is in the ON state, and the resistor Rib of the second current detection resistor 42b is bypassed by the switch element SW2. As a result, the resistance value of the second current detection resistor 42b decreases, and the voltage drop by the second current detection resistor 42b is reduced, and thus the voltage level of the current detected voltage Vs decreases. Therefore, after the point of time t36' when the AND signal Vlog enters the high level, the current detected voltage Vs is limited to the voltage level, illustrated by the solid line, which is lower than the actual voltage illustrated by the dashed line, as shown in FIG. (j) of 14.

In a case where the gate voltage Vg decreases to the ON voltage Von at a point of time t39, discharging of a capacitor between the collector and the gate in the semiconductor element of voltage-controlled type XD2 is started, and the gate voltage Vg maintains a constant value due to the Miller effect. The gate current Ig decreases to have a constant current value, the current output from the current detection terminal s also decreases to have a constant current value, and the current detected voltage Vs also decreases to a constant voltage lower than the reference voltage Vref1.

When the current detected voltage Vs is lower than or equal to the reference voltage Vref1, the overcurrent determination comparator 43a of the overcurrent detection unit 43 returns the overcurrent detection signal Vdoc to the low level. Since a period in which the current detected voltage Vs is higher than or equal to the reference voltage Vref1 is shorter than or equal to the time measurement period Tm set by the timer circuit 44, the timer circuit 44 maintains the overcurrent protection signal Sdoc at the low level as is, and the drive circuit 22 maintains the active state. Note that a point of time t40 indicates a point of time when the time measurement period Tm has elapsed from the point of time t37. Further, the dashed line indicates the current detected voltage Vs when the switch element SW2 is turned off. When the state in which the current detected voltage Vs is higher than or equal to the reference voltage Vref1 continues until the point of time t40 as indicated by the dashed line, the timer circuit 44 causes the overcurrent protection signal Sdoc to be at the high level at the point of time t40.

Then, when a mirror period ends, the gate voltage Vg starts to decrease again, and the gate current Ig flowing from the side closer to the gate terminal g to the side closer to the drive circuit 22 also decreases. In a case where the potential difference, which is obtained by subtracting the voltage on the side closer to the drive circuit 22 of the first current detection resistor Rig from the voltage on the side closer to the gate terminal g, is lower than or equal to the second threshold value, at a point of time t41, the current detection comparator 31b changes the current detection signal Vton to the low level. Accordingly, the AND signal Vlog changes from the high level to the low level, and the switch element SW2 is in the OFF state. As a result, the resistance value of the second current detection resistor 42b returns to the original value, and the voltage level of the current detected voltage Vs returns to the normal state illustrated by the dashed line. At the point of time t41, the current detected voltage Vs of which the voltage level has returned to the normal state is lower than the reference voltage Vref1, and thus the overcurrent detection signal Vdoc of the overcurrent determination comparator 43a is not at the high level, and the timer circuit 44 is not set, either.

After the gate voltage Vg enters the saturation state at the low level, the gate current Ig does not flow, and thus the overcurrent detection unit 43 does not make an erroneous determination of the transient state, and does not cause the voltage level of the current detected voltage Vs to decrease. Therefore, when the overcurrent state or the short circuit actually occurs during the OFF state of the semiconductor element XD2, the voltage level of the current detected voltage Vs is high, and thus the overcurrent determination comparator 43a sets the overcurrent detection signal Vdoc to be at the high level, and the timer circuit 44 starts the time measurement. Therefore, when the overcurrent state continues for the set time of the timer circuit 44 or longer, the timer circuit 44 outputs the high level overcurrent protection signal Sdoc to the drive circuit 22. Therefore, the drive circuit 22 transitions from the active state to the inactive state, and the drive voltage Vdrv can be suppressed or stopped to avoid the overcurrent state.

With the Modification Example, the control circuit CC2 can set the overcurrent threshold value for detecting the overcurrent to be higher in the transient period during the turn on, and additionally in the transient period during the turn off than in the normal period. Accordingly, even in the transient period during the turn off, the control circuit CC2 can reduce the possibility of erroneously detecting the overcurrent or the short circuit, the erroneous detection occurring due to the transient sensing phenomenon, while the control circuit CC2 can also detect the overcurrent or the short circuit in the normal period.

Figure 15:
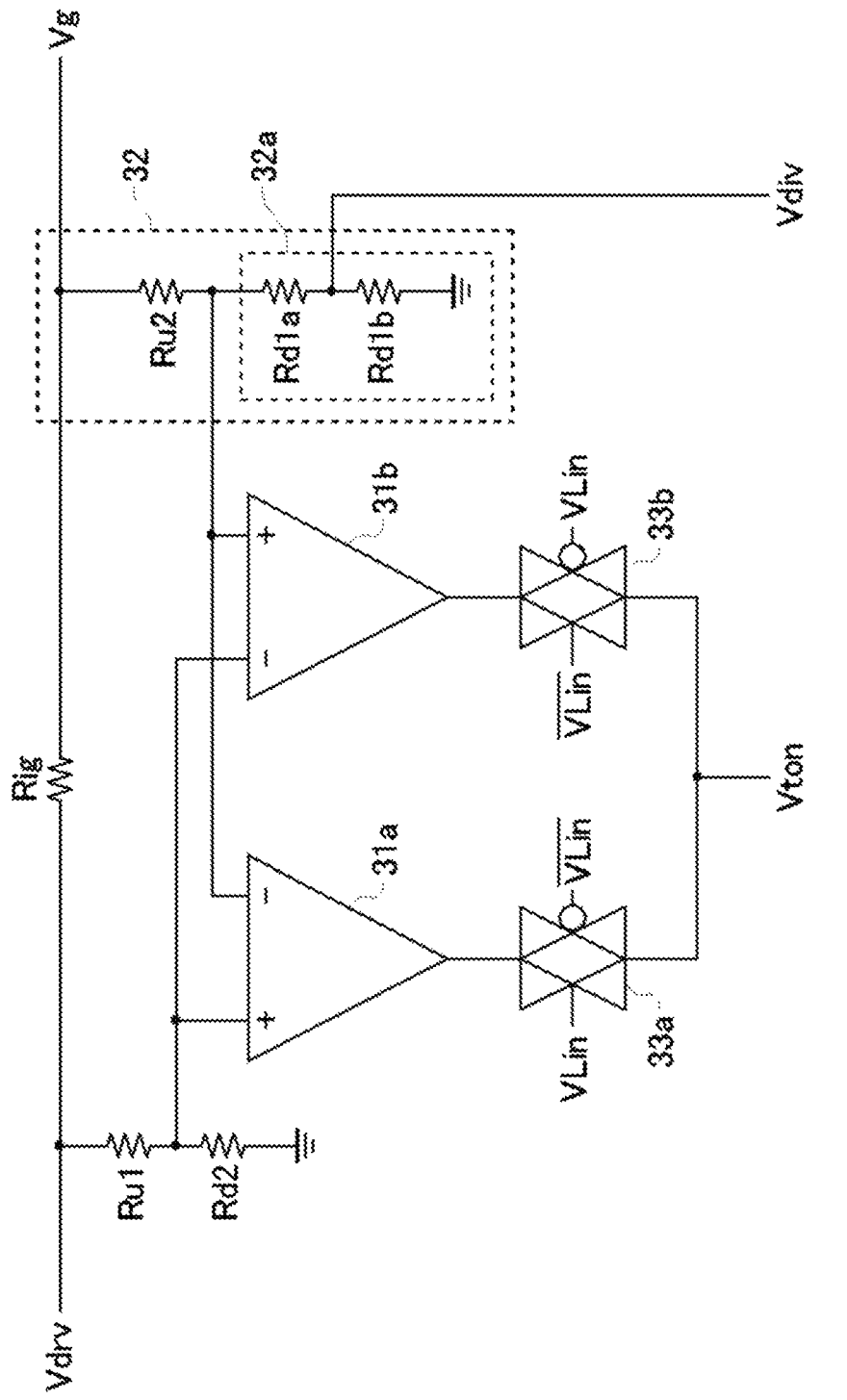
FIG. 15 shows a current detection unit and a voltage detection unit according to a ninth Modification Example.

FIG. 15 shows a current detection unit 31 and a voltage detection unit 32 according to a ninth Modification Example. The current detection unit 31 and the voltage detection unit 32 according to the Modification Example may be used instead of the current detection unit 31 and the voltage detection unit 32 in FIG. 1, FIG. 3, FIG. 4, and FIG. 6, and the Modification Examples of these, and may be used together with the overcurrent detection unit 43 and the adjustment unit 52 shown in FIG. 10 or FIG. 12. Note that the current detection unit 31 according to the Modification Example is a modification example of the current detection unit 31 shown in FIG. 13, and thus hereinafter the description will be omitted except for the differences.

The current detection unit 31 according to the Modification Example has a configuration in which the drive voltage Vdrv and the gate voltage Vg are divided to be supplied to the current detection comparators 31a, 31b. With respect to the dividing of the drive voltage Vdrv and the gate voltage Vg, the current detection unit 31 according to the Modification Example has a configuration similar to that of the current detection unit 31 shown in FIG. 7. The current detection unit 31 has the first current detection resistor Rig, the voltage dividing circuit including the resistors Ru1, Ru2, the voltage dividing circuit including the resistors Ru2, Rd1a, Rd1b, the current detection comparators 31a, 31b, and the switches 33a, 33b.

The first current detection resistor Rig is similar to the first current detection resistor Rig shown in FIG. 1 or the like. The resistors Ru1, Rd2 are connected in series in order between the terminal on the side closer to the drive circuit 22 of the first current detection resistor Rig and the ground. The voltage dividing circuit including the resistors Ru1, Rd2 is an example of a first voltage dividing circuit, and divides the voltage on the side closer to the drive circuit 22 of the first current detection resistor Rig and supplies the divided voltage to the current detection comparators 31a, 31b. The drive voltage Vdrv is divided with a ratio of Rd2/(Ru1+Rd2) by the voltage dividing circuit.

The resistors Ru2, Rda1a, Rda1b are connected in series in order between the terminal on the side closer to the gate terminal g of the first current detection resistor Rig and the ground. The voltage dividing circuit including the resistors Ru2, Rda1a, Rda1b is an example of a second voltage dividing circuit, and divides the voltage on the side closer to the gate terminal g of the first current detection resistor Rig and supplies the divided voltage to the current detection comparators 31a, 31b. The gate voltage Vg is divided with a ratio of (Rd1a+Rd1b)/(Ru2+Rd1a+Rd1b) by the voltage dividing circuit.

Here, the resistors Ru1, Rd2, Ru2, and Rd1a+Rd1b have a resistance value higher than the first current detection resistor Rig in order to reduce the influence on the magnitude of the current flowing through the first current detection resistor Rig. For example, the first current detection resistor Rig may have 100 ohms to 10 kiloohms, and in this case, the resistors Ru1, Rd2, Ru2, and Rd1a+Rd1b may have several hundred kiloohms to several megaohms.

Note that the voltage division ratios Rd2/(Ru1+Rd2) and (Rd1a+Rd1b)/(Ru2+Rd1a+Rd1b) of the resistors connected via points between both ends of the first current detection resistor Rig, and the non-inverting input terminal and the inverting input terminal of the current detection comparator 31a, may be substantially the same or different. By changing the voltage division ratios, even when the drive voltage Vdrv and the gate voltage Vg at both ends of the first current detection resistor Rig are equal (Vdrv=Vg), it is possible to obtain a reliable output by providing a difference in the input voltage of the current detection comparators 31a or the current detection comparator 31b. Note that when the first threshold value for the current detection comparator 31a to determine the potential difference, which is obtained by subtracting the voltage on the side closer to the gate terminal g of the first current detection resistor Rig from the voltage on the side closer to the drive circuit 22, is set to be high, by providing the difference in the voltage division ratio, the second threshold value for the current detection comparator 31b to determine the potential difference, which is obtained by subtracting the voltage on the side closer to the drive circuit 22 of the first current detection resistor Rig from the voltage on the side closer to the gate terminal g, becomes low. Hence, in order to enable the current detection comparator 31a to detect the current flowing from the drive circuit 22 to the gate terminal g, and in order to enable the current detection comparator 31b to detect the current flowing from the gate terminal g to the drive circuit 22, the voltage division ratio may be adjusted in a range where both of the first threshold value and the second threshold value are positive values.

The non-inverting input terminal of the current detection comparator 31a and the inverting input terminal of the current detection comparator 31b are connected to a connection point between the resistor Ru1 and the resistor Rd2. The inverting input terminal of the current detection comparator 31a and the non-inverting input terminal of the current detection comparator 31b are connected to a connection point between the resistor Ru2 and the resistor Rd1a. The current detection comparators 31a, 31b perform the operations similar to the operations of the current detection comparators 31a, 31b shown in FIG. 13 by comparing the divided voltage in accordance with the voltage Vdrv on the side closer to the drive circuit 22 of the first current detection resistor Rig, and the divided voltage in accordance with the voltage Vg on the side closer to the gate terminal g of the first current detection resistor Rig. The configurations and the operations of the switches 33a, 33b are similar to the configurations and the operations of the switches 33a, 33b in FIG. 13.

Further, in the Modification Example, similar to the configuration shown in FIG. 7, the voltage dividing circuit including the resistors Ru2, Rd1a, Rd1b also functions as the voltage detection unit 32. In the Modification Example, the voltage dividing circuit 32a in which the resistor Rd1a and the resistor Rd1b are connected in series is connected between the resistor Ru2 and the ground, and further divides the voltage supplied to the inverting input terminal of the current detection comparator 31a, and the non-inverting input terminal of the current detection comparator 31b so as to output the divided voltage as the voltage detection signal Vdiv.

Note that the configuration in which the current detection comparators 31a, 31b, and the switches 33a, 33b are included, as well, may employ the disposition of the resistors as shown in FIG. 8 or FIG. 9. In principle, the voltage detection unit 32 may have a configuration for detecting the voltage on the side closer to the gate terminal g. However, when the first current detection resistor Rig and the other resistors Ru1, Rd2, Ru2, Rd1a, Rd1b are provided outside the integrated circuit, a wiring for inputting the voltage detection signal Vdiv to the integrated circuit may be long in terms of a circuit layout design, the voltage detection signal Vdiv being obtained by dividing the voltage of the gate terminal g, and the delay of the voltage detection signal Vdiv due to the influence of a wiring impedance may increase. In such a case, the influence of the delay may be reduced by providing the voltage detection unit32 on the side closer to the drive circuit 22 of the first current detection resistor Rig to divide the drive voltage Vdrv so as to obtain the voltage detection signal Vdiv.

Figure 16:
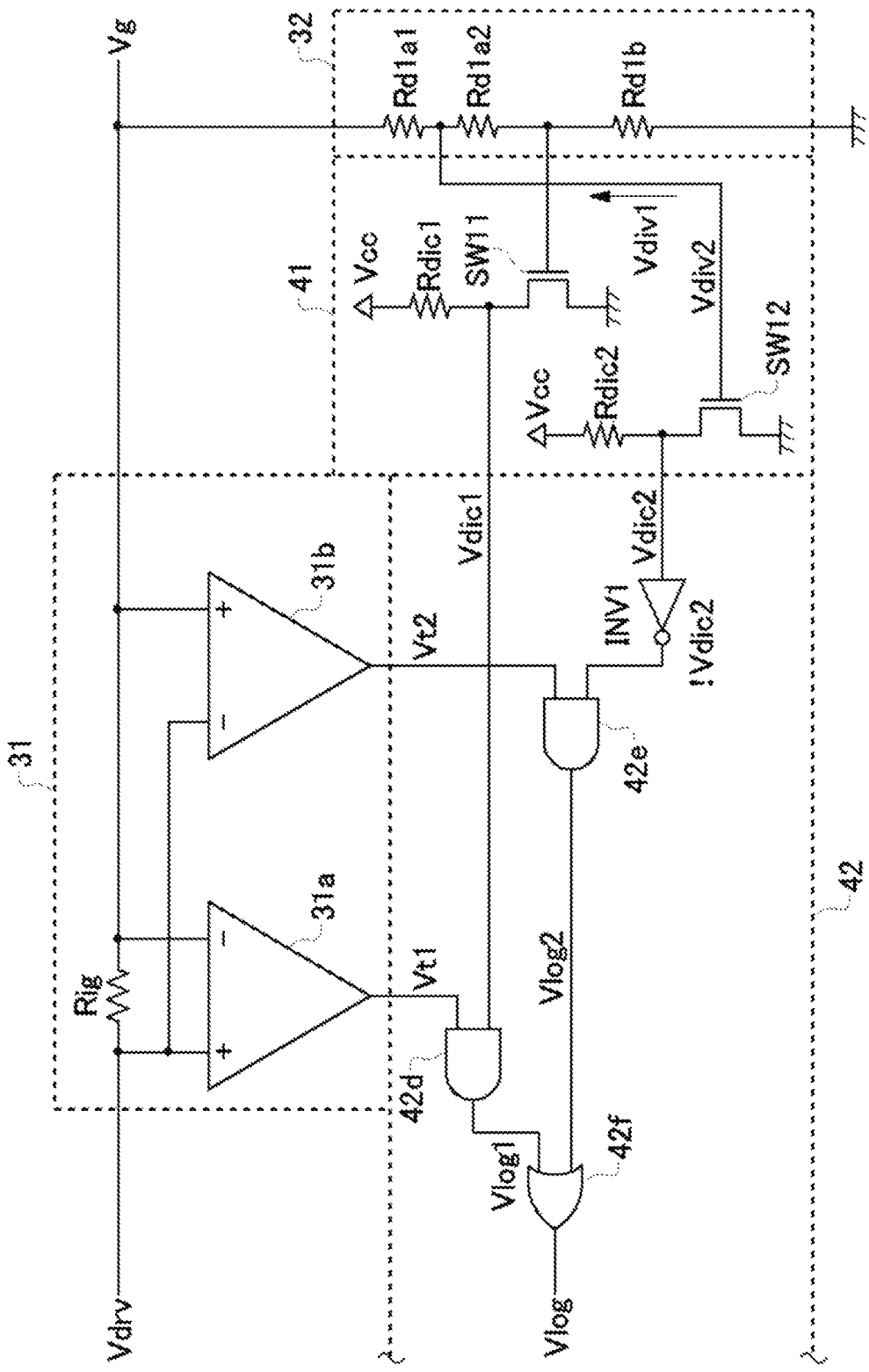
FIG. 16 shows a current detection unit, a voltage detection unit, a voltage determination unit, and a part of a voltage level adjustment unit according to a tenth Modification Example.

FIG. 16 shows a current detection unit 31, a voltage detection unit 32, a voltage determination unit 41, and a part of a voltage level adjustment unit 42 according to a tenth Modification Example. In a case where the current detection unit 31 shown in FIG. 13 to FIG. 15 is used, the voltage level adjustment unit 42 shown in FIG. 1 or the like detects the start of the transient period in response to the gate current Ig starting to flow from the side closer to the drive circuit 22 to the gate terminal g when the semiconductor element XD2 is turned on, and the voltage level adjustment unit 42 detects the end of the transient period in response to the gate voltage Vg reaching the threshold voltage Vth2 determined by subtracting a certain margin from, for example, a high level rated voltage (a high level voltage in the normal period, for example, 15 V). On the other hand, when the semiconductor element XD2 is turned off, the voltage level adjustment unit 42 shown in FIG. 1 or the like detects the start of the transient period in response to the gate voltage Vg being lower than or equal to the threshold voltage Vth2, and detects the end of the transient period in response to (almost) a stop of the flow of the gate current Ig from the gate terminal g to the drive circuit 22.

In contrast to this, the Modification Example has a configuration in which, when the semiconductor element XD2 is turned off, in a similar manner as when the semiconductor element XD2 is turned on, the start of the transient period is detected in response to the gate current Ig starting to flow, and the end of the transient period is detected in response to the gate voltage Vg being lower than or equal to the threshold voltage Vth2 (for example, 3 V) determined by adding a certain margin from, for example, a low level rated voltage (a low level voltage in the normal period, for example, 0 V).

In the Modification Example, the current detection unit 31 has the first current detection resistor Rig, and the current detection comparators 31a, 31b. The first current detection resistor Rig and the current detection comparators 31a, 31b have functions and configurations similar to those shown in FIG. 13, and thus hereinafter the description will be omitted except for the differences.

In the drawing, the current detection comparator 31a outputs a current detection signal Vt1 which is at the high level when the potential difference, which is obtained by subtracting the voltage on the side closer to the gate terminal g of the first current detection resistor Rig from the voltage on the side closer to the drive circuit 22, is greater than the first threshold value. Further, the current detection comparator 31b outputs a current detection signal Vt2 t which is at the high level when the potential difference, which is obtained by subtracting the voltage on the side closer to the drive circuit 22 of the first current detection resistor Rig from the voltage on the side closer to the gate terminal g, is greater than the second threshold value.

The voltage detection unit 32 has voltage dividing resistors Rd1a1, Rd1a2, Rd1b connected in series between the gate terminal g and the ground. A sum of the resistance values of the voltage dividing resistor Rd1a1, and the voltage dividing resistor Rd1a2 may be the same as the first voltage dividing resistor Rd1a shown in FIG. 1 or the like. The voltage dividing resistor Rd1b may be the same as the second voltage dividing resistor Rd1b shown in FIG. 1 or the like. The voltage detection unit 32 outputs, to the voltage determination unit 41, a divided voltage Vdiv1 at a connection point between the voltage dividing resistor Rd1a2 and the voltage dividing resistor Rd1b, and a divided voltage Vdiv2 at a connection point between the voltage dividing resistor Rd1a1 and the voltage dividing resistor Rd1a2. Here, the divided voltage Vdiv1 is Vg×Rd1b/(Rd1a1+Rd1a2+Rd1b), and the divided voltage Vdiv2 is Vg×(Rd1a2+Rd1b)/(Rd1a1+Rd+Rd1b), and thus the divided voltage Vdiv2 is higher than the divided voltage Vdiv1 with respect to the same gate voltage Vg.

The voltage determination unit 41 has a resistor Rdic1 and a switch element SW11, and a resistor Rdic2 and a switch element SW12. The resistor Rdic1 and the switch element SW11 have functions and configurations similar to those of the resistor Rdic and the switch element SW1 shown in FIG. 1. Here, a gate terminal of the switch element SW11 receives the divided voltage Vdiv1 from the voltage detection unit 32. When the gate voltage Vg is lower than or equal to the predetermined threshold voltage Vth2 (for example, 12 V), the resistor Rdic1 and the switch element SW11 output a voltage determination signal Vdic1 at the high level from a connection point between the resistor Rdic1 and the switch element SW11, and when the gate voltage Vg exceeds the threshold voltage Vth2, the resistor Rdic1 and the switch element SW11 output the voltage determination signal Vdic1 at the low level from the connection point. That is, the voltage determination signal Vdic1 indicates whether the gate voltage Vg has almost reached the high level rated voltage (for example, 15 V). Here, the threshold voltage Vth2 also indicates the control reference voltage in accordance with the high level.

The resistor Rdic2 and the switch element SW12 have the functions and configurations similar to those of the resistor Rdic and switch element SW1 shown in FIG. 1. Here, a gate terminal of the switch element SW12 receives the divided voltage Vdiv2 from the voltage detection unit 32. When the gate voltage Vg is lower than or equal to a predetermined threshold voltage Vth3 (for example, 3 V), the resistor Rdic2 and the switch element SW12 output a voltage determination signal Vdic2 at the high level from a connection point between the resistor Rdic2 and the switch element SW12, and when the gate voltage Vg exceeds the threshold voltage Vth3, the resistor Rdic2 and the switch element SW12 output the voltage determination signal at the low level from the connection point. That is, the voltage determination signal Vdic2 indicates whether the gate voltage Vg has almost reached the low level rated voltage (for example, 0 V). Here, the threshold voltage Vth2 also indicates the control reference voltage in accordance with the low level.

FIG. 16 shows a part of the voltage level adjustment unit 42. The configuration of the voltage level adjustment unit 42 other than a part with respect to the generation of the AND signal Vlog is similar to that of the voltage level adjustment unit 42 shown in FIG. 1 or the like, and thus the illustration and the description will be omitted.

An AND circuit 42d receives the current detection signal Vt1 output from the current detection comparator 31a of the current detection unit 31, and the voltage determination signal Vdic1 output from the voltage determination unit 41, and when both of the current detection signal Vt1 and the voltage determination signal Vdic1 are at the high levels, the AND circuit 42d outputs an AND signal Vlog1 at the high level. That is, the AND circuit 42d outputs the AND signal Vlog1 which is at the high level provided that both of a condition that the potential difference, which is obtained by subtracting the voltage Vg on the side closer to the gate terminal g of the first current detection resistor Rig from the voltage Vdrv on the side closer to the drive circuit 22, is greater than the first threshold value, and a condition that the gate voltage Vg which is the detected voltage obtained by the voltage detection unit 32 is lower than or equal to the control reference voltage Vth2 in accordance with the high level are satisfied. Such an AND signal Vlog1 indicates the transient period during the turn on of the semiconductor element XD2. Note that an operation of the AND circuit 42d is similar to that of the AND circuit 42a shown in FIG. 1.

A logical NOT circuit (a NOT circuit) INV1 negates the voltage determination signal Vdic2 (that is, inverts the logical value), and outputs a voltage determination signal !Vdic2 which is a negative value of voltage determination signal Vdic2. An AND circuit 42e receives the current detection signal Vt2 output from the current detection comparator 31b of the current detection unit 31, and the voltage determination signal !Vdic2 which is the negative value of voltage determination signal Vdic2 output from the voltage determination unit 41, and when both of the current detection signal Vt2 and the voltage determination signal !Vdic2 are at the high levels, the AND circuit 42e outputs an AND signal Vlog2 at the high level. That is, the AND circuit 42e outputs the AND signal Vlog2 which is at the high level provided that both of a condition that the potential difference, which is obtained by subtracting the voltage Vdrv on the side closer to the drive circuit 22 of the first current detection resistor Rig from the voltage Vg on the side closer to the gate terminal g, is greater than the second threshold value, and a condition that the gate voltage Vg which is the detected voltage obtained by the voltage detection unit 32 is higher than or equal to the control reference voltage Vth3 in accordance with the low level are satisfied. Such an AND signal Vlog2 indicates the transient period during the turn off of the semiconductor element XD2.

A logical sum circuit (an OR circuit) 42f takes a logical sum of the AND signal Vlog1 from the AND circuit 42d, and the AND signal Vlog2 from the AND circuit 42e, and outputs the logical sum as the AND signal Vlog. Accordingly, the OR circuit 42f can output the AND signal Vlog which is at the high level in the transient period during the turn on and turn off of the semiconductor element XD2, and which is at the low level during the other period (the normal period).

Other parts of the voltage level adjustment unit 42 perform the operations similar to the operations shown in FIG. 1. Accordingly, based on the AND signal Vlog, the second current detection resistor 42b and the switch element SW2 can adjust the overcurrent threshold value in both of the transient periods during the turn on of the semiconductor element XD2 and the turn off of the semiconductor element XD2 to be higher than the overcurrent threshold value in the period other than the transient periods.

Figure 17:
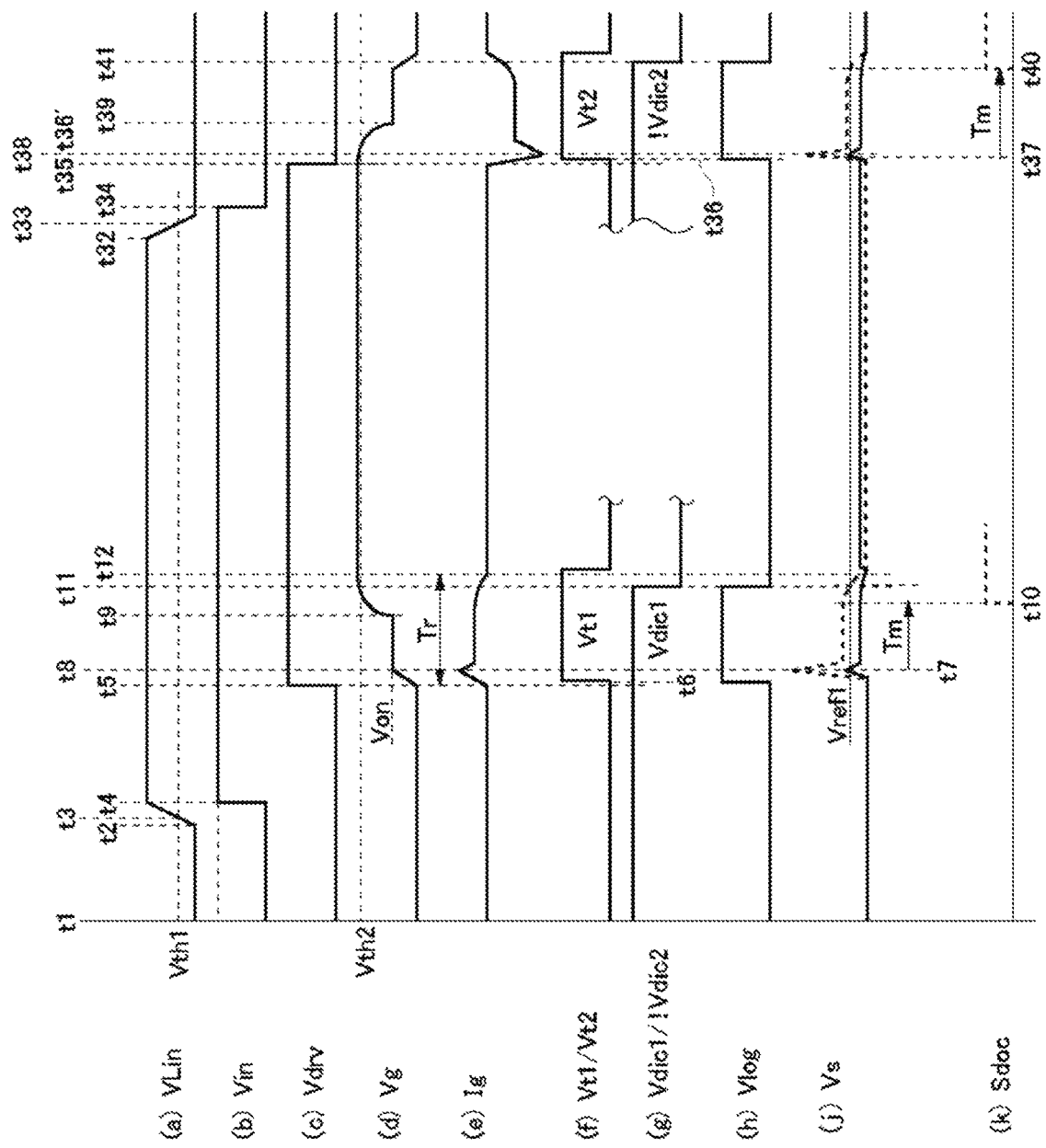
FIG. 17 shows a signal waveform according to an operation of the tenth Modification Example.

FIG. 17 shows a signal waveform according to an operation of the tenth Modification Example. The signal waveform is similar to the signal waveform shown in FIG. 14, and thus hereinafter the description will be omitted except for the differences. As described with reference to FIG. 16, in the turn on operation of the semiconductor element XD2, the control circuit CC2 adjusts the overcurrent threshold value in the transient period by using the AND signal Vlog1 of the current detection signal Vt1 and the voltage determination signal Vdic1 as the AND signal Vlog, the control circuit CC2 employing the current detection unit 31, the voltage detection unit 32, the voltage determination unit 41, and a part of the voltage level adjustment unit 42 in FIG. 16, and in the turn off operation of the semiconductor element XD2, the control circuit CC2 adjusts the overcurrent threshold value in the transient period by using the AND signal Vlog2 of the current detection signal Vt2 and the voltage determination signal !Vdic2 as the AND signal Vlog. Hence, in FIG. 17, the signal waveform of the current detection signal Vt1 is shown in the turn on operation, and the signal waveform of the current detection signal Vt2 is shown in the turn off operation, and thus instead of the signal waveform of "(f) Vton" in FIG. 14, the signal waveform is denoted by "(f) Vt1/Vt2". Further, in FIG. 17, the signal waveform of the voltage determination signal Vdic1 is shown in the turn on operation, and the signal waveform of the voltage determination signal !Vdic2 is shown in the turn off operation, and thus instead of the signal waveform of "(g) Vdic" in FIG. 14, the signal waveform is denoted by "(g) Vdic1/!Vdic2".

The signal waveform in the turn on operation in FIG. 17 is the same as the signal waveform in the turn on operation in FIG. 14 except that the current detection signal Vt1 which is substantially the same as the current detection signal Vton is used during the turn on operation, and that the voltage detection signal Vdic1 which is substantially the same as the voltage detection signal Vdic is used during the turn on operation, and thus the description will be omitted.

In the steady ON state of the semiconductor element XD2 (for example, before the point of time t32), the gate voltage Vg is higher than or equal to the control reference voltage Vth3 in accordance with the low level, and thus the voltage determination signal !Vdic2 is at the high level. Therefore, in a case where the current detection comparator 31b inverts the current detection signal Vt2 from the low level to the high level in accordance with the potential difference between both ends of the first current detection resistor Rig being greater than the second threshold value at the point of time t36, the AND signal Vlog changes from the low level to the high level. Therefore, after the point of time t36, the current detected voltage Vs is limited to the voltage level, illustrated by the solid line, which is lower than the actual voltage illustrated by the dashed line, as shown in FIG. (j) of 17.

In a case where the current detected voltage Vs illustrated by the solid line exceeds the reference voltage Vref1 at the point of time t37, the overcurrent detection unit 43 outputs the overcurrent detection signal Vdoc which is at the high level while the current detected voltage Vs exceeds the reference voltage Vref1. Accordingly, the timer circuit 44 is set to start the time measurement.

In a case where the gate voltage Vg is lower than the control reference voltage Vth3 in accordance with the low level at the point of time t41, the voltage determination signal !Vdic2 changes from the high level to the low level, and accordingly the AND signal Vlog changes from the high level to the low level. After the point of time t41, the current detected voltage Vs returns to the actual voltage illustrated by the dashed line in (j) of FIG. 17.

In the Modification Example, in accordance with conditions that in the turn off operation of the semiconductor element XD2, the potential difference, which is obtained by subtracting the voltage Vdrv on the side closer to the drive circuit 22 of the first current detection resistor Rig from the voltage Vg on the side closer to the gate terminal g, is greater than the second threshold value, and that the detected voltage obtained by the voltage detection unit 32 is higher than or equal to the control reference voltage Vth3 on a low level side, it is possible to detect the transient period during the turn off so as to set the overcurrent threshold value to be higher in comparison with the normal period. Accordingly, it is possible to determine the transient period and adjust the overcurrent threshold value with higher precision in comparison with the Modification Examples shown in FIG. 13 to FIG. 15.

Note that the Modification Example can be applied to a configuration in which the modification example of FIG. 10 or FIG. 12 is applied to the embodiment of FIG. 1 or the like. In this case, based on the detection result of the current detection unit 31, the adjustment unit 52 can set the sense reference voltage in the transient period during the turn on and turn off of the semiconductor element XD2 to be higher than the sense reference voltage in the period other than the transient period. For example, the adjustment unit 52 can set the sense reference voltage in the transient period during the turn on and turn off of the semiconductor element XD2 to be higher than the sense reference voltage in the period other than the transient period in accordance with a condition that the potential difference, which is obtained by subtracting the voltage Vg on the side closer to the gate terminal g of the first current detection resistor Rig from the voltage Vdrv on the side closer to the drive circuit 22, is greater than the first threshold value, and the detected voltage obtained by the voltage detection unit 32 is lower than or equal to the high level control reference voltage Vth2 (a condition for the transient period during the turn on), or that the potential difference, which is obtained by subtracting the voltage Vdrv on the side closer to the drive circuit 22 of the first current detection resistor Rig from the voltage Vg on the side closer to the gate terminal g, is greater than the second threshold value, and the detected voltage obtained by the voltage detection unit 32 is higher than or equal to the low level control reference voltage Vth3 (a condition for the transient period during the turn off).

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A current detection circuit comprising:
   a current detection unit that detects a control current flowing between a control terminal of a semiconductor element of voltage-controlled type having a current detection terminal, and a drive circuit;
   an overcurrent detection unit that detects an overcurrent in response to a sense current exceeding an overcurrent threshold value set to an operating level, the sense current flowing through the current detection terminal; and
   an adjustment unit that sets, based on a detection result of the current detection unit, the overcurrent threshold value in a transient period during turn on and turn off of the semiconductor element to a transient level higher than the operating level, the overcurrent threshold value being set to the operating level in a period other than the transient period,
   wherein the overcurrent detection unit detects the overcurrent during the transient period when the sense current exceeds the transient level.

2. The current detection circuit according to claim 1, wherein the current detection unit detects a potential difference between a side closer to the control terminal and a side closer to the drive circuit of a first current detection resistor which is electrically connected between the control terminal and the drive circuit.

3. The current detection circuit according to claim 2, further comprising:
   a voltage detection unit that detects a voltage on the side closer to the drive circuit or the side closer to the control terminal of the first current detection resistor; and
   a voltage determination unit that determines whether the detected voltage obtained by the voltage detection unit exceeds a control reference voltage,
   wherein the adjustment unit adjusts the overcurrent threshold value, further based on a determination result of the voltage determination unit.

4. The current detection circuit according to claim 3,
wherein the adjustment unit sets the overcurrent threshold value to the transient level, provided that both of a condition that the potential difference, which is obtained by subtracting the voltage on the side closer to the control terminal of the first current detection resistor from the voltage on the side closer to the drive circuit, is greater than a first threshold value or that the potential difference, which is obtained by subtracting the voltage on the side closer to the drive circuit of the first current detection resistor from the voltage on the side closer to the control terminal, is greater than a second threshold value and a condition that the detected voltage obtained by the voltage detection unit is lower than or equal to the control reference voltage are satisfied.

5. The current detection circuit according to claim 2,
wherein the current detection unit includes:
a first comparator that determines whether the potential difference, which is obtained by subtracting a voltage on the side closer to the control terminal of the first current detection resistor from a voltage on the side closer to the drive circuit, is greater than a first threshold value;
a second comparator that determines whether the potential difference, which is obtained by subtracting the voltage on the side closer to the drive circuit of the first current detection resistor from the voltage on the side closer to the control terminal, is greater than a second threshold value; and
a selector that selects which of an output of the first comparator or an output of the second comparator is to be output as the detection result of the current detection unit in accordance with a control signal for controlling the semiconductor element.

6. The current detection circuit according to claim 5,
wherein the selector outputs the output of the first comparator as the detection result of the current detection unit when the control signal indicates that the semiconductor element is to be turned on, and outputs the output of the second comparator as the detection result of the current detection unit when the control signal indicates that the semiconductor element is to be turned off.

7. The current detection circuit according to claim 5,
wherein the current detection unit further includes:
a first voltage dividing circuit that divides the voltage on the side closer to the drive circuit of the first current detection resistor and supplies the divided voltage to the first comparator and the second comparator; and
a second voltage dividing circuit that divides the voltage on the side closer to the control terminal of the first current detection resistor and supplies the divided voltage to the first comparator and the second comparator.

8. A semiconductor module comprising:
a semiconductor element of voltage-controlled type;
a drive circuit that drives a control terminal of the semiconductor element; and
the current detection circuit according to claim 1.

9. A current detection method comprising:
detecting a control current flowing between a control terminal of a semiconductor element of voltage-controlled type having a current detection terminal, and a drive circuit;
detecting an overcurrent in response to a sense current exceeding an overcurrent threshold value set to an operating level, the sense current flowing through the current detection terminal; and
adjusting, based on a detection result of the control current, the overcurrent threshold value in a transient period during turn on and turn off of the semiconductor element to a transient level higher than the operating level, the overcurrent threshold value being set to the operating level in a period other than the transient period,
wherein the overcurrent is detected during the transient period when the sense current exceeds the transient level.

10. The current detection method according to claim 9,
wherein the detecting of the control current includes detecting a potential difference between a side closer to the control terminal and a side closer to the drive circuit of a first current detection resistor which is electrically connected between the control terminal and the drive circuit.

11. The current detection method according to claim 10, further comprising:
detecting a voltage on the side closer to the drive circuit or the side closer to the control terminal of the first current detection resistor; and
determining whether the detected voltage obtained across the first current detection resistor exceeds a control reference voltage,
wherein the adjusting includes adjusting the overcurrent threshold value, further based on a result of the determining.

12. The current detection method according to claim 11,
wherein the adjusting includes setting the overcurrent threshold value to the transient level, provided that both of a condition that the potential difference, which is obtained by subtracting the voltage on the side closer to the control terminal of the first current detection resistor from the voltage on the side closer to the drive circuit, is greater than a first threshold value or that the potential difference, which is obtained by subtracting the voltage on the side closer to the drive circuit of the first current detection resistor from the voltage on the side closer to the control terminal, is greater than a second threshold value and a condition that the detected voltage across the first current detection resistor is lower than or equal to the control reference voltage are satisfied.

13. The current detection method according to claim 10,
wherein the detecting of the control current includes:
performing a first determination that determines whether the potential difference, which is obtained by subtracting a voltage on the side closer to the control terminal of the first current detection resistor from a voltage on the side closer to the drive circuit, is greater than a first threshold value;
performing a second determination that determines whether the potential difference, which is obtained by subtracting the voltage on the side closer to the drive circuit of the first current detection resistor from the voltage on the side closer to the control terminal, is greater than a second threshold value; and
selecting which of a result of the first determination or a result of the second determination is to be output as the detection result of the control current in accordance with a control signal for controlling the semiconductor element.

14. The current detection method according to claim 13, wherein the selecting includes outputting the result of the first determination as the detection result of the control current when the control signal indicates that the semiconductor element is to be turned on, and outputting the result of the second determination as the detection result of the control current when the control signal indicates that the semiconductor element is to be turned off.

15. The current detection method according to claim 13, wherein the detecting of the control current further includes:
dividing the voltage on the side closer to the drive circuit of the first current detection resistor and supplies the divided voltage for the first determination and the second determination; and
dividing the voltage on the side closer to the control terminal of the first current detection resistor and supplies the divided voltage for the first determination and the second determination.

* * * * *